United States Patent
Managaki et al.

(10) Patent No.: US 9,913,367 B2
(45) Date of Patent: Mar. 6, 2018

(54) WIRING BOARD AND METHOD OF MANUFACTURING THE SAME

(71) Applicant: Kabushiki Kaisha Toshiba, Minato-ku (JP)

(72) Inventors: Nobuto Managaki, Kawasaki (JP); Tadahiro Sasaki, Nerima (JP); Atsuko Iida, Yokohama (JP); Yutaka Onozuka, Yokohama (JP); Hiroshi Yamada, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 712 days.

(21) Appl. No.: 14/585,657

(22) Filed: Dec. 30, 2014

(65) Prior Publication Data

US 2015/0201488 A1 Jul. 16, 2015

(30) Foreign Application Priority Data

Jan. 10, 2014 (JP) ................................. 2014-003365

(51) Int. Cl.
 *H05K 1/00* (2006.01)
 *H05K 1/02* (2006.01)
 *H05K 1/16* (2006.01)

(52) U.S. Cl.
 CPC ........... *H05K 1/0222* (2013.01); *H05K 1/162* (2013.01); *H05K 1/165* (2013.01); *H05K 1/167* (2013.01); *H05K 2201/0187* (2013.01); *H05K 2201/0195* (2013.01)

(58) Field of Classification Search
 CPC ...... H05K 1/0222; H05K 1/162; H05K 1/165; H05K 1/167; H05K 2201/0187; H05K 2201/0195; H05K 1/00; H05K 1/02; H05K 1/16; H05K 3/00; H05K 1/09; H05K 1/11; H05K 1/18; H05K 1/181; H05K 3/0088
 USPC ........ 174/262, 263, 250, 255, 260; 361/312, 361/313, 760, 761, 767, 762
 See application file for complete search history.

(56) References Cited

U.S. PATENT DOCUMENTS

| 4,985,600 A | * | 1/1991 | Heerman | H05K 1/116 174/255 |
|---|---|---|---|---|
| 6,884,313 B2 | | 4/2005 | Liu et al. | |
| 8,164,920 B2 | * | 4/2012 | Kariya | H05K 1/11 361/764 |
| 8,174,840 B2 | * | 5/2012 | Jow | H05K 1/162 174/250 |

(Continued)

FOREIGN PATENT DOCUMENTS

| JP | 8-97525 A | 4/1996 |
|---|---|---|
| JP | 11-204945 A | 7/1999 |

(Continued)

*Primary Examiner* — Angel R Estrada

(74) *Attorney, Agent, or Firm* — Oblon, McClelland, Maier & Neustadt, L.L.P.

(57) ABSTRACT

A wiring board of an embodiment includes a through via, a first insulating film disposed around the through via, a second insulating film disposed around the first insulating film, a third insulating film disposed around the second insulating film and a resin disposed around the third insulating film. The resin includes fillers. The second insulating film has a relative permittivity lower than a relative permittivity of the first insulating film. The third insulating film has a relative permittivity higher than a relative permittivity of the second insulating film.

15 Claims, 40 Drawing Sheets

(56) References Cited

U.S. PATENT DOCUMENTS

| | | | | |
|---|---|---|---|---|
| 8,730,429 B2* | 5/2014 | Lee | ................. | H05K 1/00 361/704 |
| 8,766,101 B2* | 7/2014 | Miyairi | ................. | H05K 1/00 174/255 |
| 2010/0244059 A1 | 9/2010 | Iida et al. | | |
| 2012/0228755 A1 | 9/2012 | Nagano et al. | | |

FOREIGN PATENT DOCUMENTS

| | | |
|---|---|---|
| JP | 2003-60115 | 2/2003 |
| JP | 2005-159268 A | 6/2005 |
| JP | 2007-234715 A | 9/2007 |
| JP | 2009-239147 | 10/2009 |
| JP | 2010-40721 | 2/2010 |
| JP | 2010-67623 | 3/2010 |
| JP | 2010-232577 | 10/2010 |
| JP | 2012-190855 | 10/2012 |
| JP | 2012-216601 | 11/2012 |
| JP | 2013-58545 | 3/2013 |

* cited by examiner

WIRING BOARD AND METHOD OF MANUFACTURING THE SAME

CROSS-REFERENCE TO RELATED APPLICATION

This application is based upon and claims the benefit of priority from Japanese Patent Application No. 2014-003365, filed on Jan. 10, 2014, the entire contents of which are incorporated herein by reference.

FIELD

Embodiments described herein relate generally to a wiring board and a method of manufacturing the wiring board.

BACKGROUND

In recent years, as a high-density packing technology, System on Chip (SoC) and System in Package (SiP) are proposed, and a development race is becoming active in view of downsizing, high integration, multifunctionality, low cost, and the like. In these techniques, a plurality of semiconductor chips having different functions constitutes a single package or module. As a joining technique of those chips, there is used, other than a wire bonding method, a technique of interlayer moving wiring such as through vias, bump electrodes, or direct joining of substrates.

In addition, as an packing technology using those techniques of interlayer moving wiring, a three dimensional packing technology which is called Package on Package (PoP) is proposed. In PoP, a wiring board having a semiconductor chip sealed thereon has another wiring board mounted thereon. For example, in one form of PoP, a semiconductor chip is mounted on one of the main surfaces of a substrate of a wiring board; many internal connection electrodes coupled via a coupling substrate are connected to the wiring board to make electrode wirings; and another wiring board is further mounted thereon.

In PoP, as internal connection electrodes, through mold vias are widely used. One form of the through mold via has a structure in which a through hole in a filler-containing resin is filled with conductor. The filler-containing resin is often made to include 80% or more of inorganic filler to make a coefficient of thermal expansion of the resin close to that of an electronic component made of Si. Further, the inorganic filler generally has a permittivity much different from that of the molding resin.

The through mold via formed in the filler-containing resin is connected to the electronic component, and the frequency of a signal passing through the through mold via is 1 GHz or higher. Insertion loss of the signal in that frequency is greatly affected by the permittivity around the through via. The permittivity of the inorganic filler is, for example, approximately 4, and the permittivity of the molding resin is, for example, approximately 3. In this case, since substances having different permittivities exist inhomogeneously in the resin, the insertion loss is increased.

DETAILED DESCRIPTION

A wiring board of an embodiment includes: a through via; a first insulating film disposed around the through via; a second insulating film disposed around the first insulating film, the second insulating film having a relative permittivity lower than a relative permittivity of the first insulating film; a third insulating film disposed around the second insulating film, the third insulating film having a relative permittivity higher than the relative permittivity of the second insulating film; and a resin disposed around the third insulating film, the resin including fillers.

First Embodiment

A wiring board of the present embodiment includes: a through via; a first insulating film disposed around the through via; a second insulating film disposed around the first insulating film, the second insulating film having a relative permittivity lower than a relative permittivity of the first insulating film; a third insulating film disposed around the second insulating film, the third insulating film having a relative permittivity higher than the relative permittivity of the second insulating film; and a resin disposed around the third insulating film, the resin including fillers.

Figure 1:
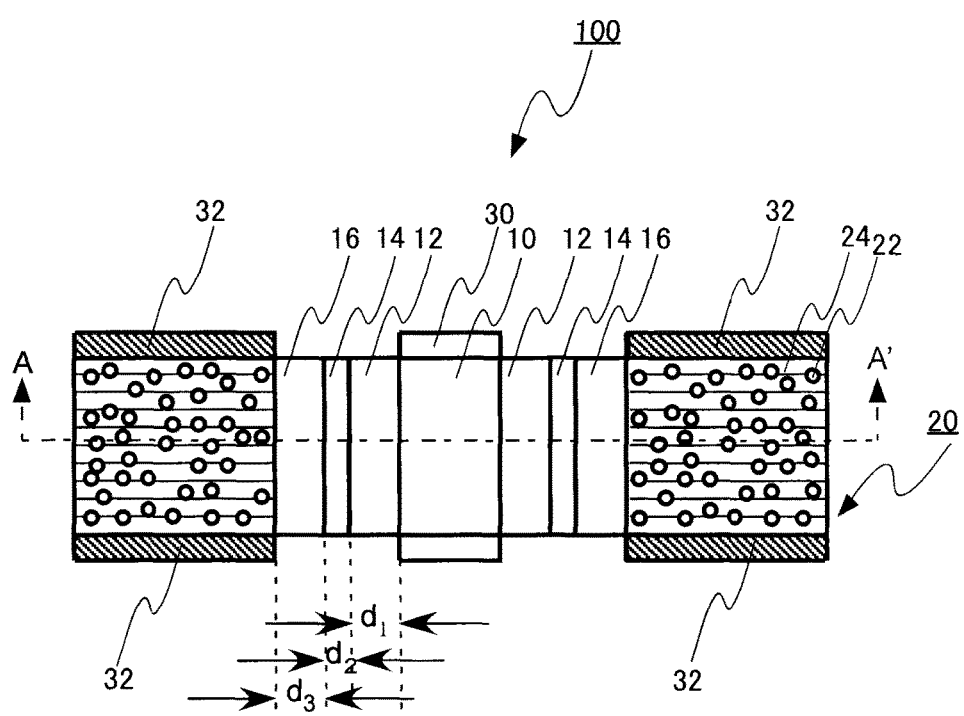
FIG. 1 a schematic cross-sectional view of a wiring board of a first embodiment.
Figure 2:
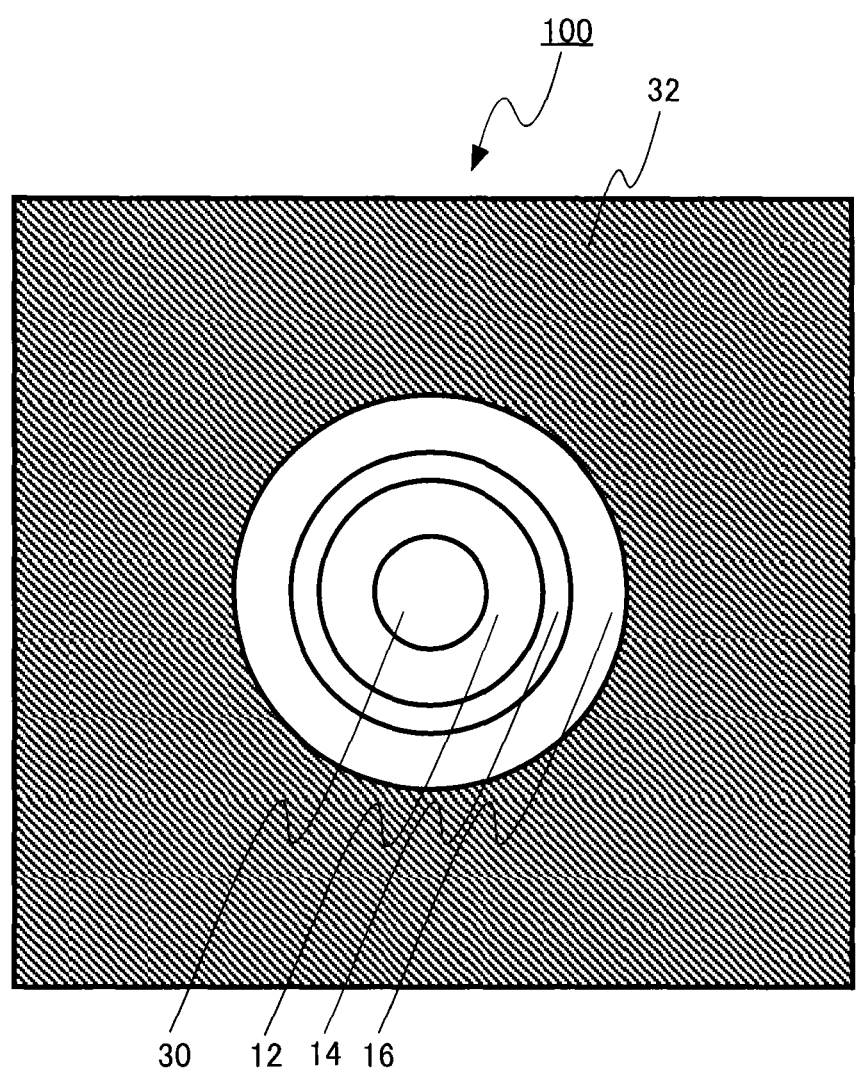
FIG. 2 is schematic top view of the wiring board of the first embodiment.
Figure 3:
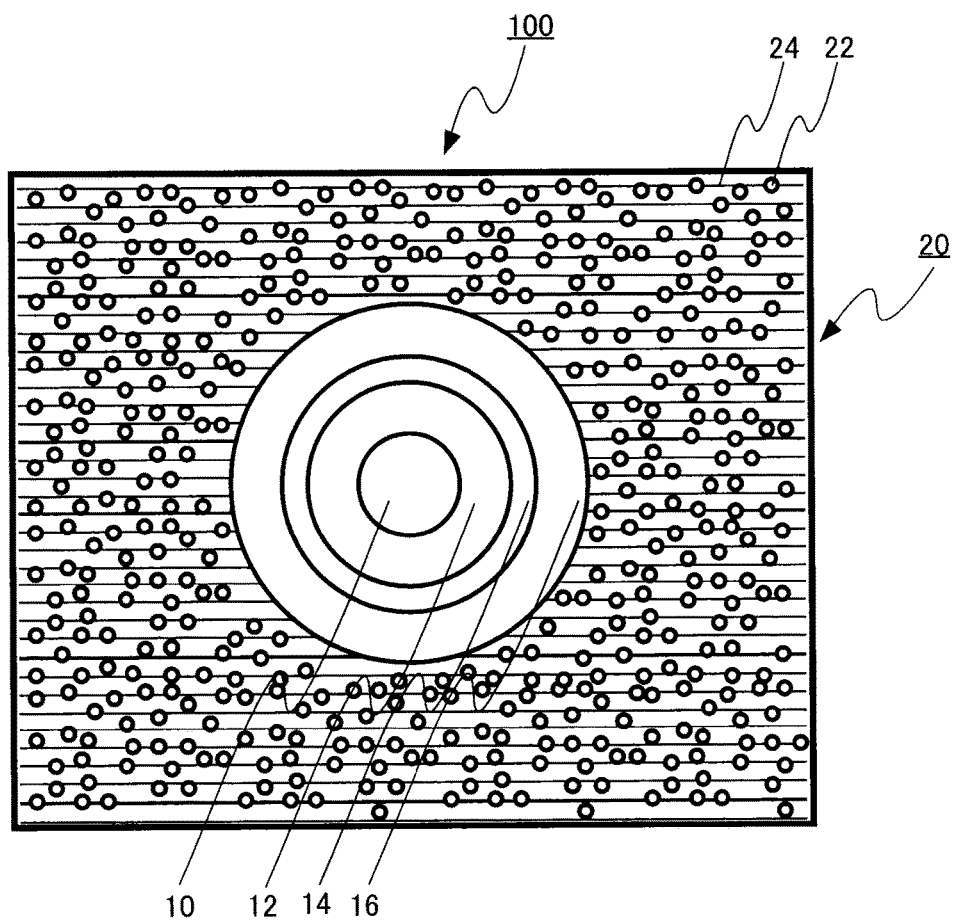
FIG. 3 is a schematic cross-sectional view of the wiring board of the first embodiment taken along line A-A'.

FIG. 1 is a schematic cross-sectional view of the wiring board 100 of the present embodiment. FIG. 2 is a schematic top view of the wiring board 100 of the present embodiment, and FIG. 3 is a schematic cross-sectional view of the wiring board 100 of the present embodiment taken along line A-A'.

Through a through via 10 an electric signal passes, which is sent to or from a semiconductor chip and the like disposed on the wiring board, for example. It is preferable that material of the through via 10 includes at least one type of conductor selected from the group consisting of gold (Au), silver (Ag), cupper (Cu), nickel (Ni), tungsten (W), tin (Sn), and a conductive organic substance in order to attain high conductivity.

Specifically preferable material of the through via 10 is metal such as Au, Ag, and Cu, which are generally used for electric wiring.

Other materials also can be preferably used such as Li, Be, Na, Mg, Al, K, Ca, Sc, Ti, V, Cr, Mn, Fe, Co, Zn, Ga, Rb, Sr, Y, Zr, Nb, Mo, Tc, Ru, Rh, Pd, Cd, Sn, Cs, Ba, La, Ce, Pr, Pm, Nd, Sm, Eu, Gd, Tb, Dy, Ho, Er, Tm, Yb, and Lu and an alloy of the above metals.

As conductive organic substances used for the through via 10, organic substance such as polyacetylene, poly (p-phenylene), poly (p-phenylenevinylene), polypyrrole, polythiophene, polyaniline, polythiophene, polyacene, and graphene is preferably used.

A first insulating film 12 is disposed around the through via 10, a second insulating film 14 having a relative permittivity lower than a relative permittivity of the first insulating film 12 is disposed around the first insulating film 12, and a third insulating film 16 having a relative permittivity higher than the relative permittivity of the second insulating film 14 is disposed around the second insulating film 14, respectively.

As materials for the first insulating film 12, the second insulating film 14, and the third insulating film 16, polyethylene (PE), polypropylene (PP), polytetrafluoroethylene (PTFE), polyvinyl chloride (PVC), polyvinyl alcohol (PVA), polyvinyl phenol, polyvinyl pyrrolidone (PVP), polystyrene (PS), polyacrylate, polymethylmethacrylate (PMMA), polyacrylonitrile (PAN), polycarbonate (PC), polyterephthalate ethylene (PET), parylene, polyphenylene sulfide (PPS), polyimide (PI), benzocyclobutene (BCB), cyclopentene (CyPe), polysilsesquioxane (PSQ), and SOG (Spin-On-Glass) are preferably used. Among the above materials, polyimide (PI) and SOG (Spin-On-Glass) are specifically preferably used.

It is possible to control the permittivities of the first insulating film 12, the second insulating film 14, and the third insulating film 16 by appropriately mixing a plurality of substances from the above group of substances by using a known technique, or by appropriately changing synthesis conditions by using a known technique, or the like.

Around the third insulating film 16, a filler-containing resin 20 is disposed. The filler-containing resin 20 includes filler 22 and resin 24.

The filler 22 is a filler generally used to control thermal expansion or the like, and inorganic oxide particles such as silica, alumina, aluminum nitride, boron nitride, zinc oxide, magnesium oxide, and zinc oxide and dielectric particles such as barium titanate, strontium titanate, barium strontium titanate, strontium zirconate, and bismuth zirconate are preferably used, for example. Among the above materials, silica is specifically preferably used.

As the resin 24, it is possible to preferably use, for example, a phenol resin, a polyester resin, an epoxy resin, a polyimide resin, a fluorine resin, and the like. Among the above resins, an epoxy resin is specifically preferably used. Further, when a base material to be a core of the wiring board is used, paper or glass cloth can be preferably used.

The wiring board of the present embodiment may be further provided with an electrode wiring. The electrode wiring is used for transmission of a signal or the like. The electrode wiring is disposed in contact with the surface of the through via 10 as an electrode wiring 30 or is disposed on the surface of the filler-containing resin 20 as an electrode wiring 32, for example. The electrode wiring may be also disposed inside the filler-containing resin 20.

Figure 4:
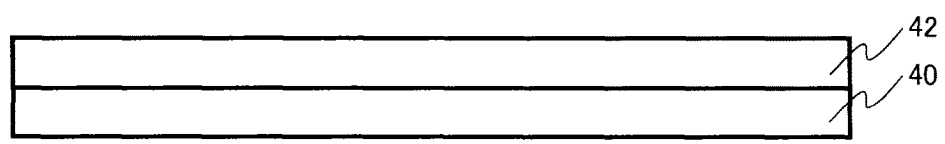
FIG. 4 is a schematic cross-sectional view showing a method of manufacturing the wiring board of the first embodiment.
Figure 5:
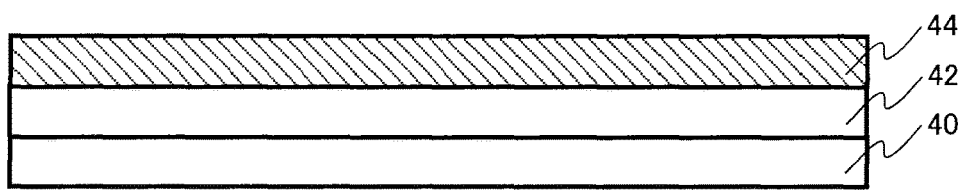
FIG. 5 is a schematic cross-sectional view showing the method of manufacturing the wiring board of the first embodiment.

A method of manufacturing the wiring board of the present embodiment will be described below. FIGS. 4 to 12 are schematic cross-sectional views showing the method of manufacturing the wiring board of the present embodiment, respectively. Firstly, as shown in FIG. 4, an adhesive layer 42 is formed on a support substrate 40. Next, as shown in FIG. 5, a seed layer 44 is formed on the adhesive layer 42. As the material of the seed layer, known materials can be preferably used, and Ti, Cu, Sn, Ni, Ta, and Ag are specifically preferably used. The seed layer preferably has a film thickness of not less than 1 µm. The seed layer is preferably formed by a known method such as a sputtering method, a vacuum vapor deposition method, an electroless plating method, and a sputtering method can be specifically preferably used.

Figure 6:
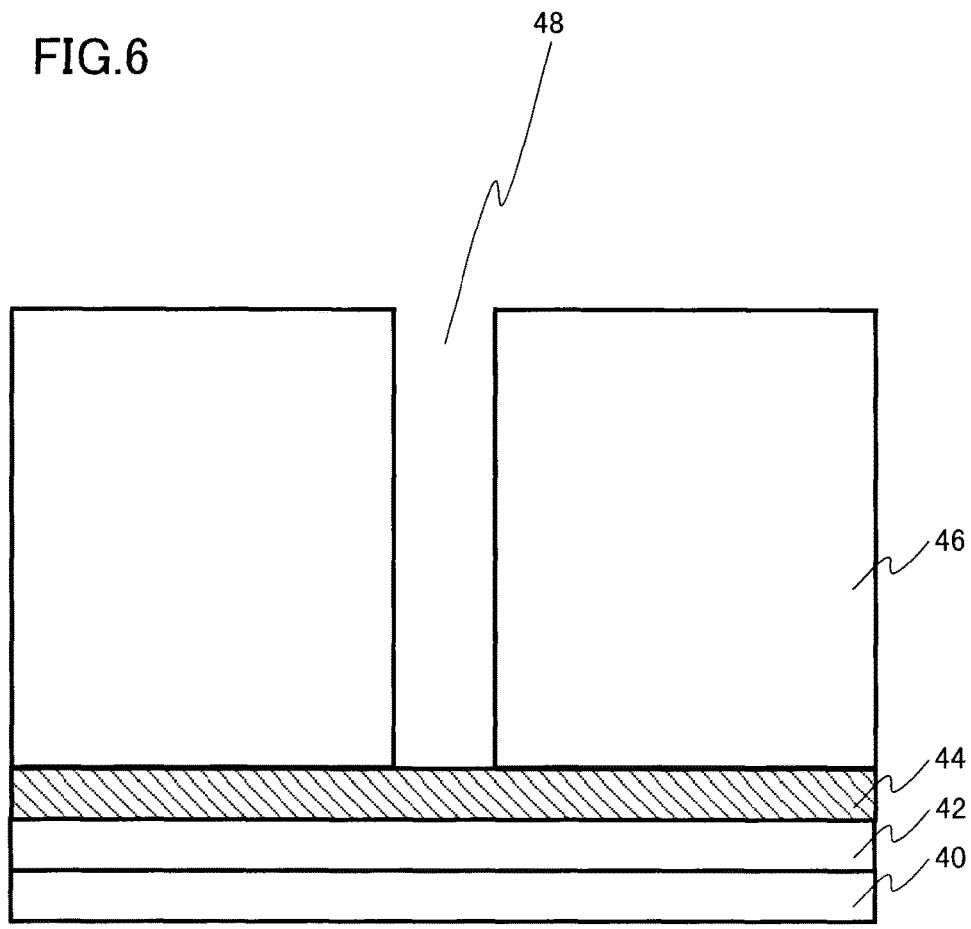
FIG. 6 is a schematic cross-sectional view showing the method of manufacturing the wiring board of the first embodiment.
Figure 7:
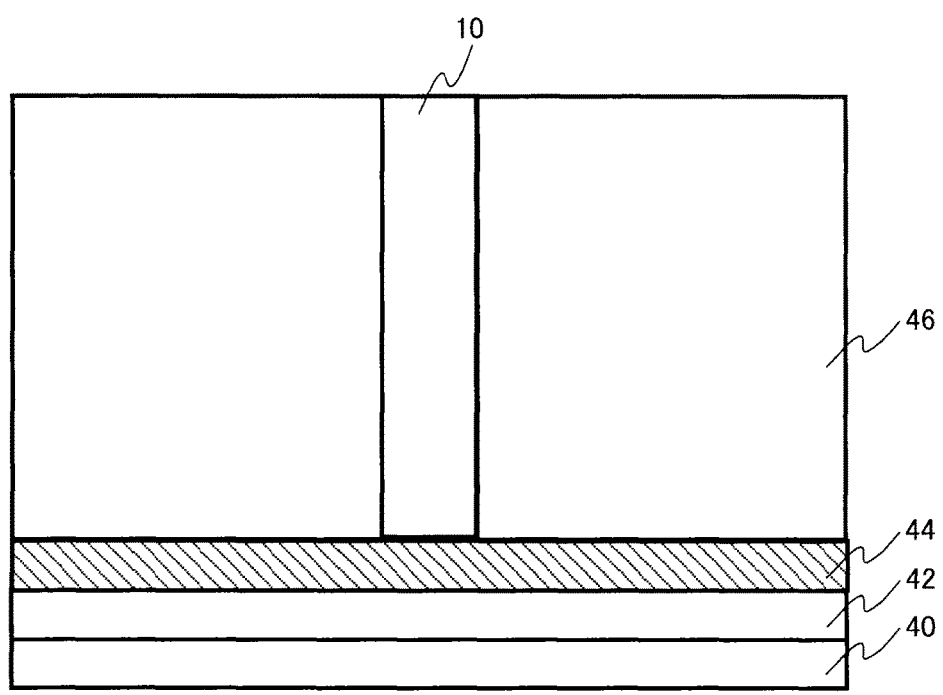
FIG. 7 is a schematic cross-sectional view showing the method of manufacturing the wiring board of the first embodiment.

Next, as shown FIG. 6, a resist 46 is applied on the surface of the seed layer 44 and is patterned by exposure to form an opening 48. Then, as shown in FIG. 7, the through via 10 is formed in the opening 48. The through via 10 is preferably formed by an electroplating method, for example.

Figure 8:
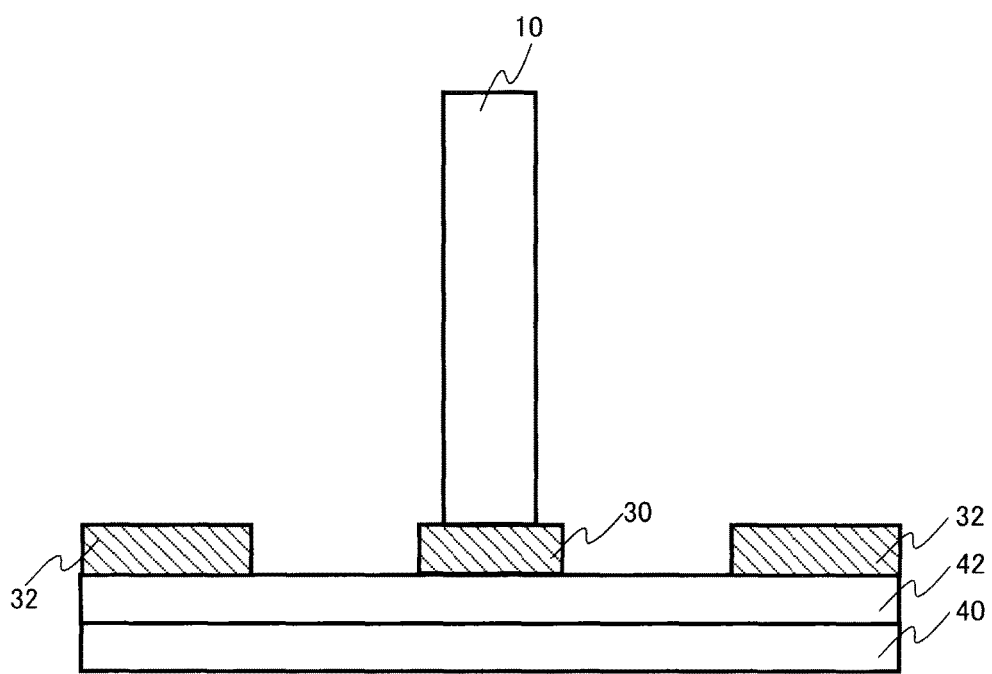
FIG. 8 is a schematic cross-sectional view showing the method of manufacturing the wiring board of the first embodiment.

Next, as shown in FIG. 8, the resist 46 is peeled off by organic cleaning or the like. At this time, the electrode wiring 30 and the electrode wiring 32 may be formed by using the seed layer 44, by wet etching or the like.

Figure 9:
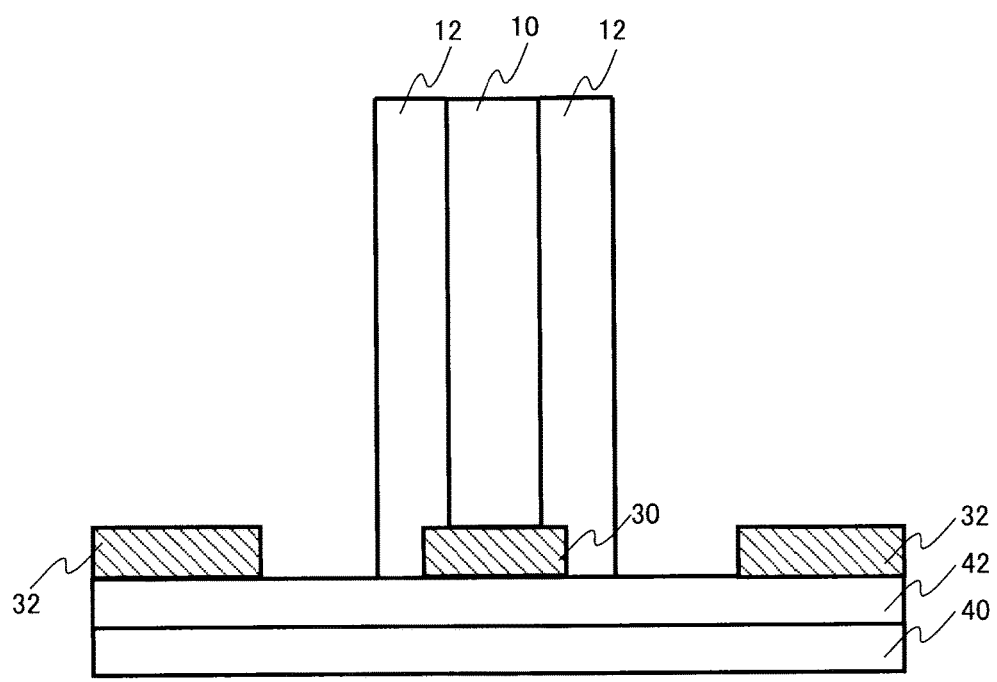
FIG. 9 is a schematic cross-sectional view showing the method of manufacturing the wiring board of the first embodiment.
Figure 10:
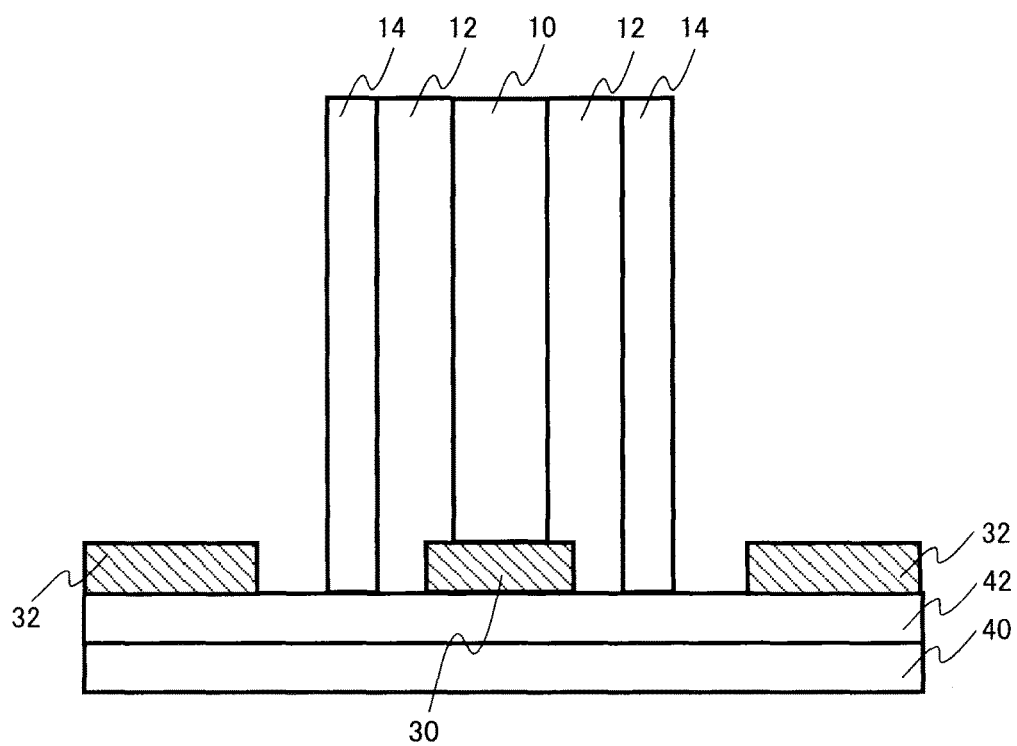
FIG. 10 is a schematic cross-sectional view showing the method of manufacturing the wiring board of the first embodiment.
Figure 11:
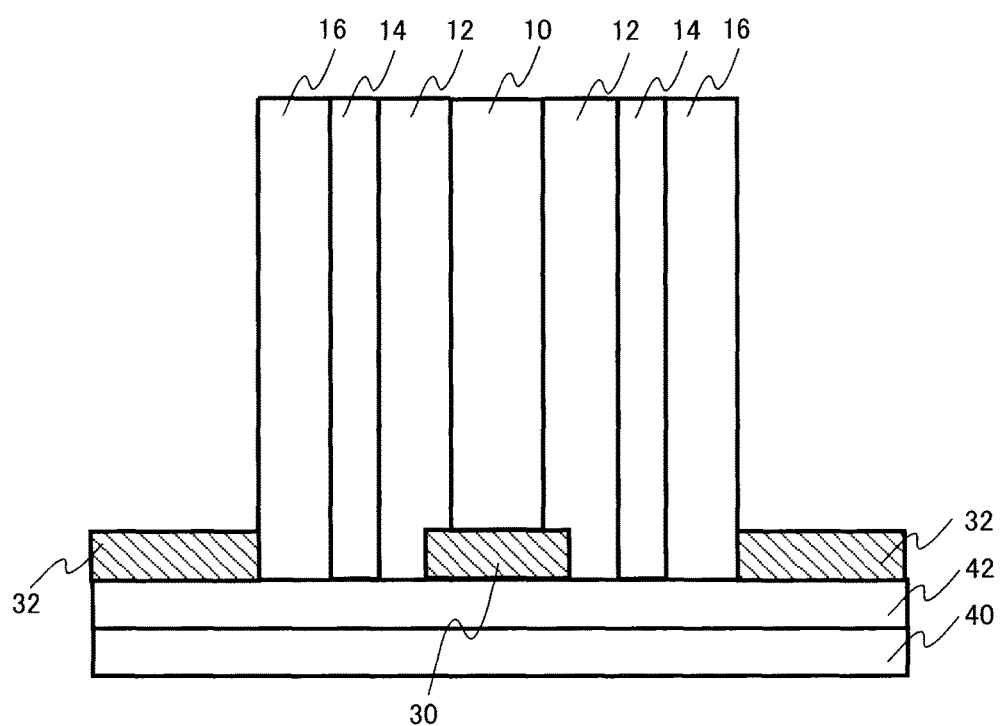
FIG. 11 is a schematic cross-sectional view showing the method of manufacturing the wiring board of the first embodiment.

Next, as shown in FIG. 9, the first insulating film 12 is formed around the through via 10. Next, as shown in FIG. 10, the second insulating film 14 is formed around the first insulating film 12. Next, as shown in FIG. 11, the third insulating film 16 is formed around the second insulating film 14. It is preferable that the first insulating film 12, the second insulating film 14, and the third insulating film 16 are formed by coating by using a spin coating method.

Figure 12:
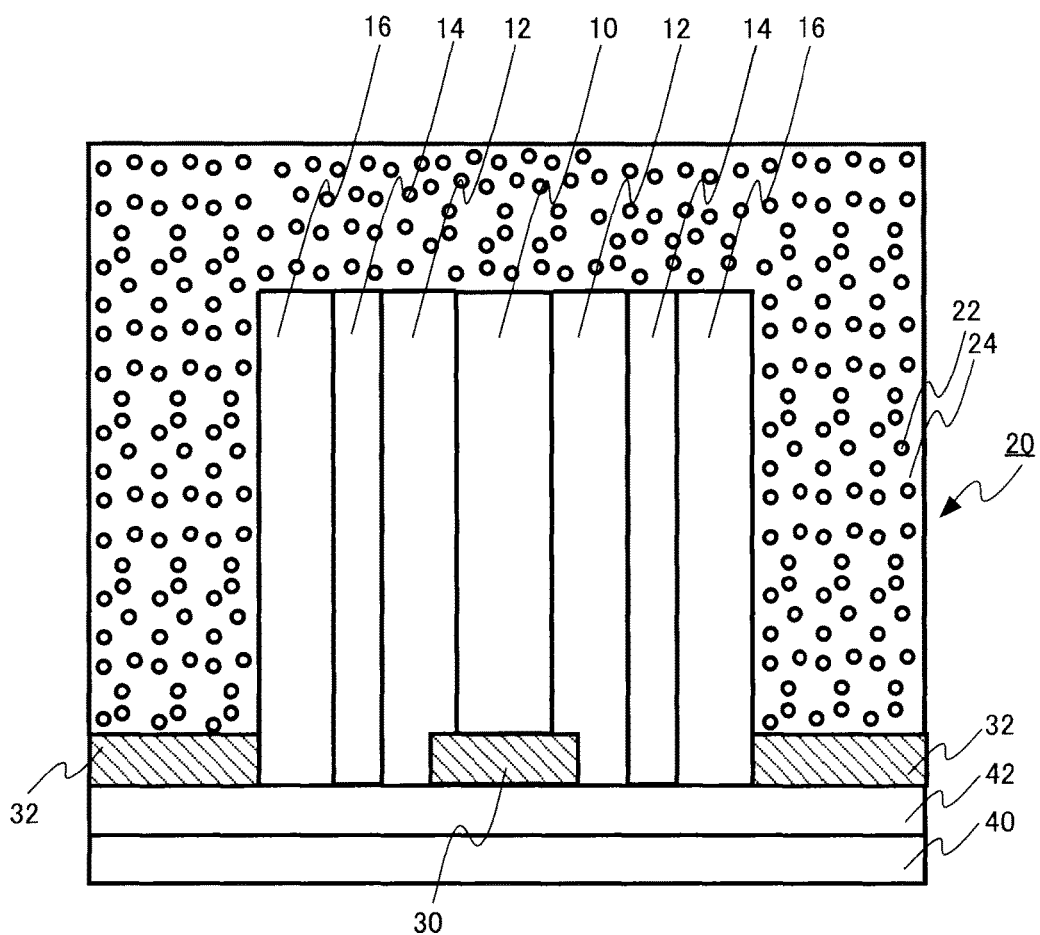
FIG. 12 is a schematic cross-sectional view showing the method of manufacturing the wiring board of the first embodiment.

Next, as shown in FIG. 12, the periphery is filled with the filler-containing resin 20. It is preferable that the filler-containing resin 20 is filled by a resin printing device.

Figure 13:
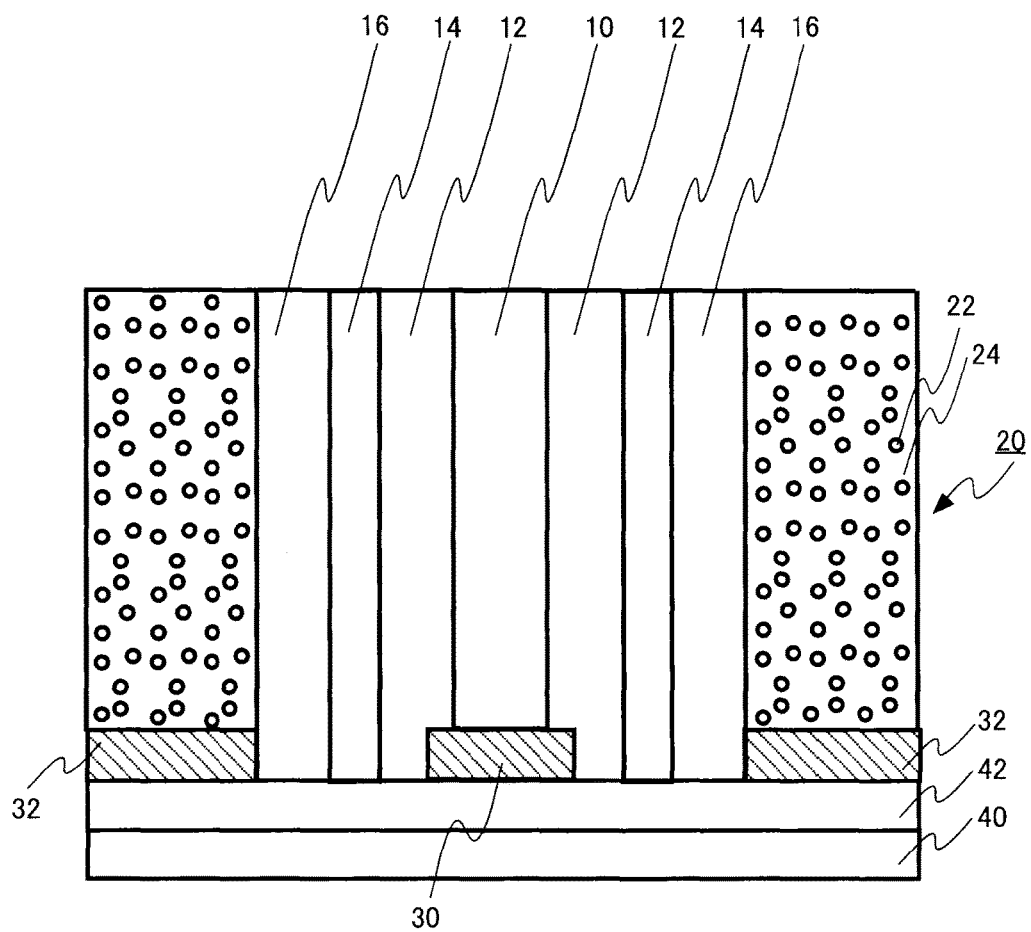
FIG. 13 is a schematic cross-sectional view showing the method of manufacturing the wiring board of the first embodiment.
Figure 14:
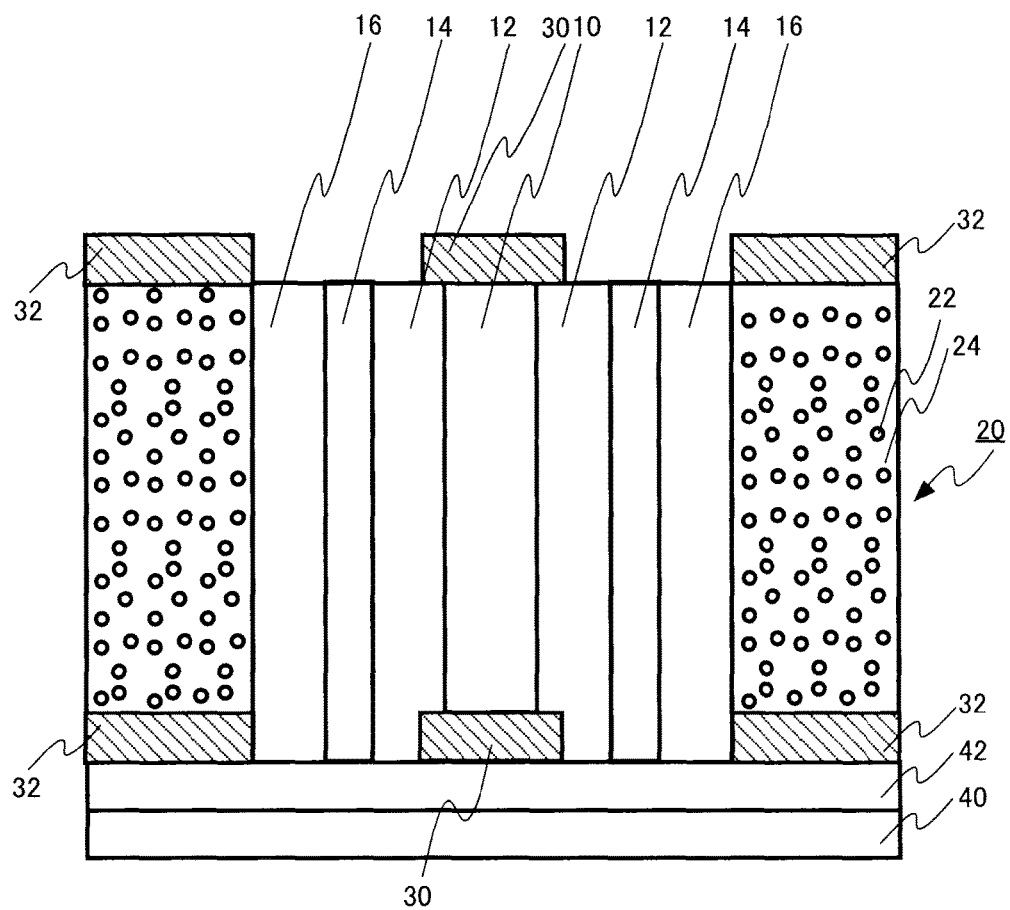
FIG. 14 is a schematic cross-sectional view showing the method of manufacturing the wiring board of the first embodiment.
Figure 15:
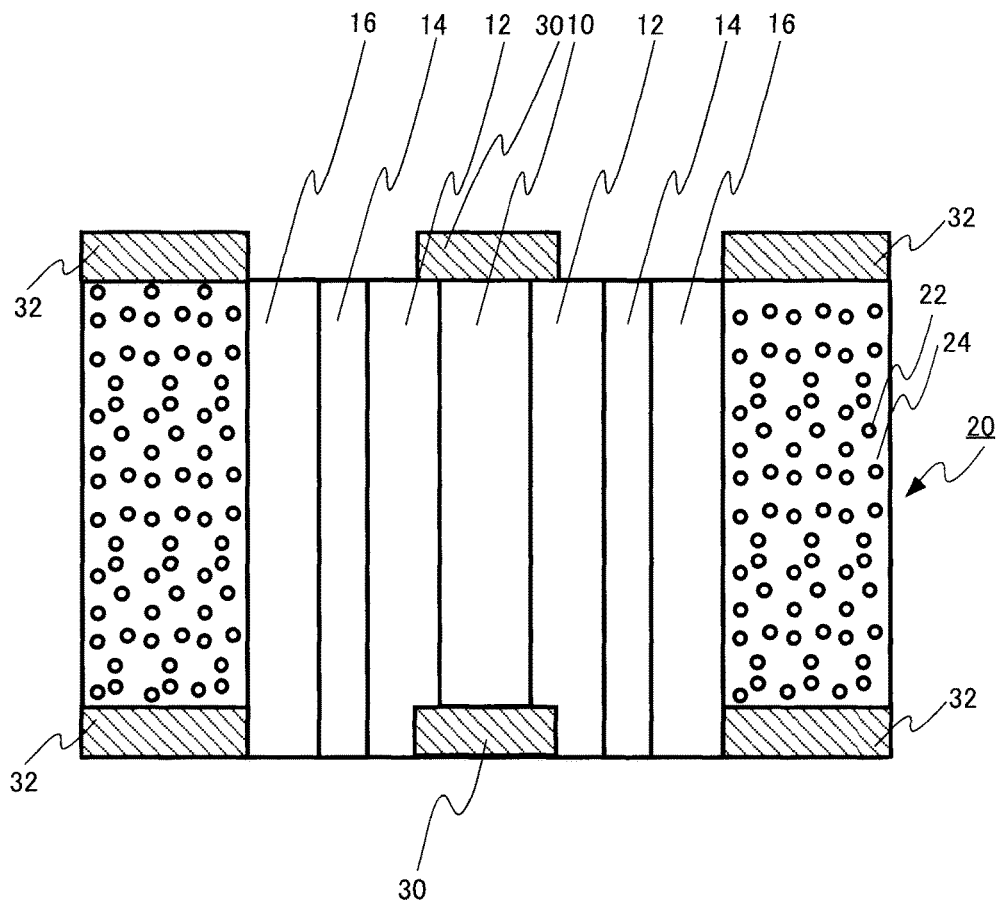
FIG. 15 is a schematic cross-sectional view showing the method of manufacturing the wiring board of the first embodiment.

Next, as shown in FIG. 13, the filled filler-containing resin 20 is planarized by resin polishing. Next, as shown in FIG. 14, on the planarized surface, the electrode wiring 30 is formed. Finally, as shown in FIG. 15, by removing the adhesive layer 42, the wiring board 100 of the present embodiment is manufactured.

For example, when a signal in a frequency band of about 1 GHz to 30 GHz passes through the through via 10, electricity flows through the through via 10, and at the same time, an electric field spreads on the surface of the through via 10 due to the skin effect of radio wave. The permittivity of the filler and the permittivity of the resin are generally different. Thus, there is a problem that, in the case that the filler-containing resin 20 is in direct contact with the periphery of the through via 10, substances having different permittivities are distributed in an area in which the radio wave spreads, whereby the radio wave is scattered and insertion loss is accordingly increased.

For example, when only one type of insulating film, which is the first insulating film 12, is disposed, it is necessary to make the film thickness of the insulating film around the through via thicker according to the expansion of the radio wave associated with an increase in power passing through. In this case, there is a problem that an advantageous effect of the thicker film thickness is about the same as that of the case in which the filler is not included even if the film thickness is made thicker.

For example, in the case that two types of the insulating films, which are the first insulating film 12 and the second insulating film 14, are disposed, it is possible to trap the radio wave in the first insulating film. As a result, compared with the case that one type of the insulating film, which is the first insulating film 12, is disposed, a high effect can be obtained even if the film thickness of the entire insulating films is made thin. However, there is a problem also in this case that the effect is about the same as in the case that the filler is not contained, even if the film thickness is made thicker.

The wiring board of the present embodiment includes: a through via; a first insulating film disposed around the through via; a second insulating film disposed around the first insulating film, the second insulating film having a relative permittivity lower than a relative permittivity of the first insulating film; a third insulating film disposed around the second insulating film, the third insulating film having a relative permittivity higher than the relative permittivity of the second insulating film; and a resin disposed around the third insulating film, the resin including fillers. With this arrangement, when an electric signal is transmitted through the through via 10, the radio wave spreading around the through via 10 is trapped in the second insulating film, whereby the insertion loss can be suppressed.

Here, the effect of suppression of the increase of the insertion loss is greater than the case of a through mold via containing no filler. It is noted that relative permittivities of insulating films can be evaluated by spectroscopic ellipsometry or a network analyzer.

In addition, it is preferable that the permittivity of the first insulating film 12 is same as the permittivity of the third insulating film 16 so that the radio wave is trapped similarly in both sides of the second insulating film 14. However, the permittivity of the first insulating film 12 may be different from the permittivity of the third insulating film 16.

It is preferable that the first insulating film 12, the second insulating film 14, and the third insulating film 16 each has a ring structure having the central axis in a direction perpendicular to the principal surface of the wiring board. In other words, it is preferable that the first insulating film 12, the second insulating film 14, and the third insulating film 16 have cylindrical shapes having through holes passing through in the direction perpendicular to the bottom surfaces of the cylindrical shapes. With this arrangement, the radio wave passing through the through via can be uniformly trapped in the direction perpendicular to the bottom surface.

It is preferable that the relative permittivity of the first insulating film and the relative permittivity of the third insulating film are not less than 2.4 and not more than 9. When an insulating film with a relative permittivity lower than 2.4 is used for the first insulating film and the third insulating film, the difference from the relative permittivity of the second insulating film is too small to successfully trap the radio wave in the second insulating film. On the other hand, generally, there is a negative correlation between the relative permittivity and a band gap of an insulating film; thus, a material with too high relative permittivity has a narrow band gap, whereby an insulation property of the insulating film deteriorates. As a result, the insertion loss can be increased.

It is preferable that the film thickness of the second insulating film is not less than 2.7% and not more than 20% of the sum of the film thickness of the first insulating film and the film thickness of the third insulating film. If the film thickness is too thin, it is not possible to trap the radio wave successfully; thus, the radio wave leaks into the first insulating film and the third insulating film. On the other hand, if the second insulating film is too thick, the radio wave spreads too much in the second insulating film, whereby the insertion loss can increase, on the contrary.

It is preferable that a ratio of (i) a difference between a distance from the inside surface of the first insulating film to the center of the film thickness of the second insulating film and a half of a distance from the inside surface of the first insulating film to the outside surface of the third insulating film to (ii) a distance from the inside surface of the first insulating film to the outside surface of the third insulating film is not more than 0.2. With this arrangement, the second insulating film is disposed approximately at the center of the entire insulating films including the first insulating film, the second insulating film, and the third insulating film, and the insertion loss due to filler can be effectively prevented further from increasing.

It is preferable that a sum of the film thickness of the first insulating film and the film thickness of the third insulating film is not less than 89% of a sum of the film thickness of the first insulating film, the film thickness of the second insulating film, and the film thickness of the third insulating film. In order to prevent the scattering of the radio wave by the filler, it is preferable that the first insulating film and the third insulating film have certain film thicknesses.

It is noted that the film thickness of the insulating film represents the film thickness in a cross-section parallel to the main surface of the wiring board in the present specification. For example, in the case of the wiring board of FIG. 1, the film thickness of the first insulating film 12 is denoted by $d_1$. The film thickness of the second insulating film is denoted by $d_2$. The film thickness of the third insulating film is denoted by $d_3$.

According to the wiring board 100 of the present embodiment, with the above-described configuration, it is possible to reduce the loss in the through via and to provide a wiring board provided with a low-loss through via. In addition, by the manufacturing method of the present embodiment, it is possible to manufacture a wiring board provided with such low-loss through via.

Second Embodiment

A wiring board of the present embodiment is a wiring board of the first embodiment in which an electrode wiring is further provided, and the electrode wiring includes a strip-line. In the following description, the same points as in the first embodiment will be omitted.

Figure 16:
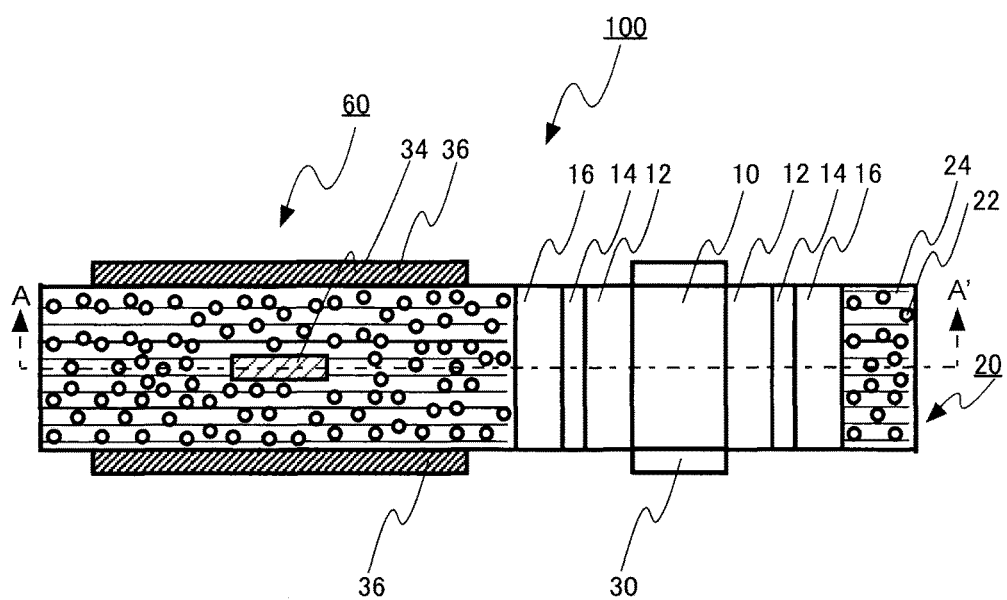
FIG. 16 is a schematic cross-sectional view of a wiring board of a second embodiment.
Figure 17:
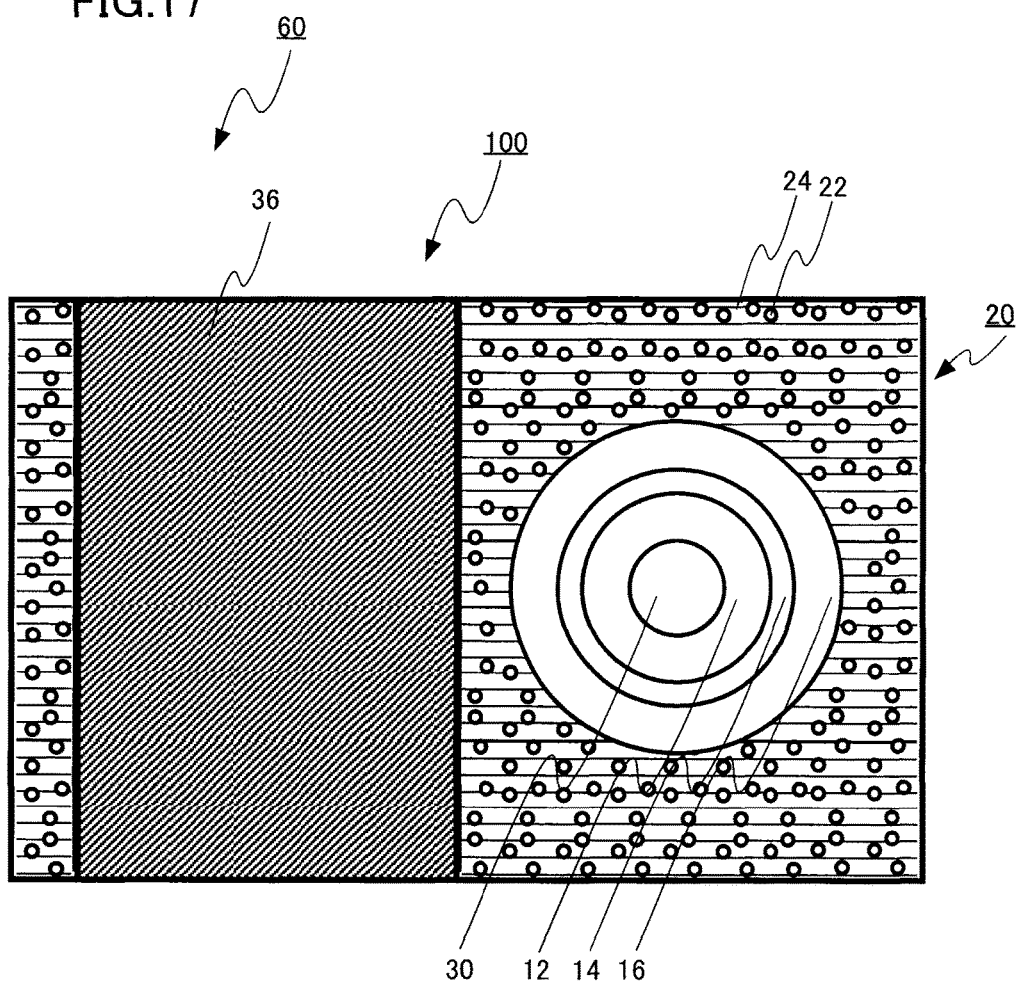
FIG. 17 is a schematic top view of the wiring board of the second embodiment.
Figure 18:
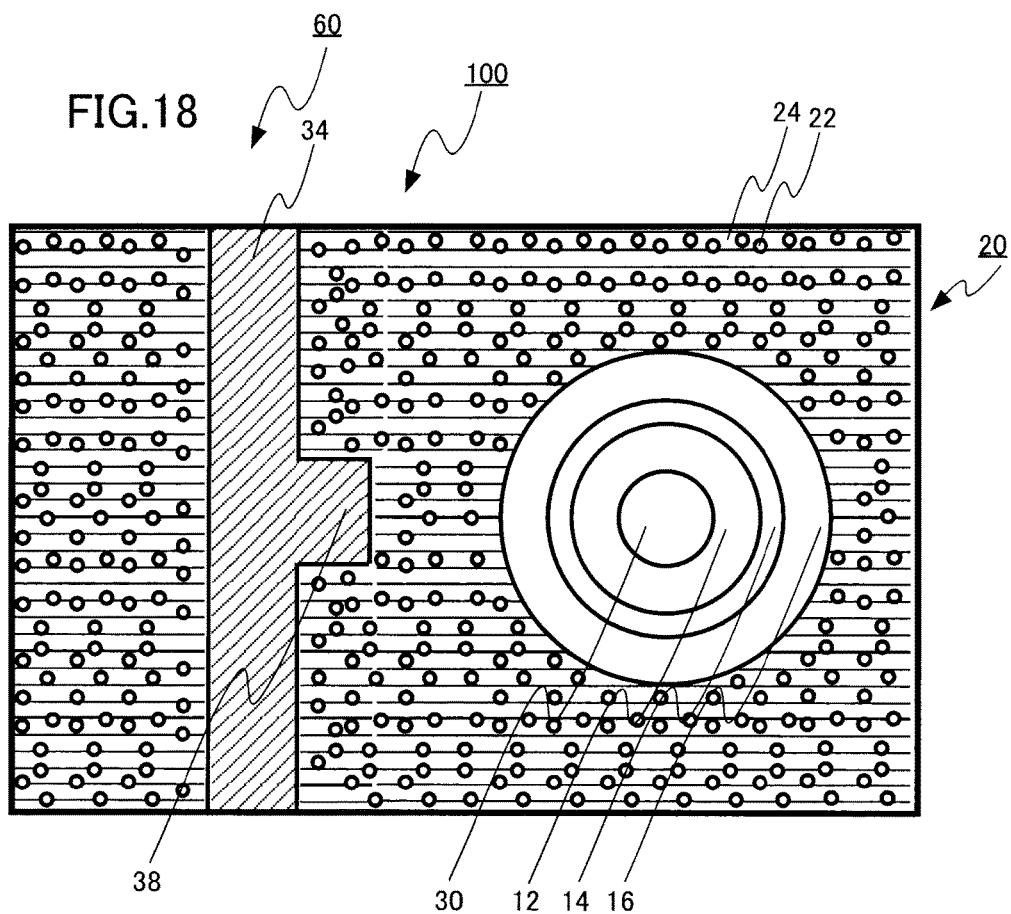
FIG. 18 is a schematic cross-sectional view of the wiring board of the second embodiment taken along line A-A'.

FIG. 16 is a schematic cross-sectional view of a wiring board 100 of the present embodiment. FIG. 17 is a schematic top view of the wiring board 100 of the present embodiment, and FIG. 18 is a schematic cross-sectional view of the wiring board 100 of the present embodiment taken along line A-A'.

A strip-line 60 includes two electrode wirings 36 disposed on the surfaces of the wiring board 100 and an electrode wiring 34 disposed inside the wiring board 100, for example. The two electrode wirings 36 are used as ground lines, and the electrode wiring 34 is used as a signal line.

On the electrode wiring 34, there may be disposed a stub 38. The stub 38 functions as a capacitor or an inductor, depending on the size thereof.

It is noted that a form of the strip-line 60 preferably used in the present embodiment is not limited to the above-described form, and any known strip-line can be preferably used.

According to the wiring board 100 of the present embodiment, with the above-described configuration, it is possible to provide a wiring board provided with a low-loss through via 10 and the strip-line 60.

Third Embodiment

A wiring board of the present embodiment is a wiring board of the first embodiment in which an electrode wiring is further provided, and the electrode wiring includes a micro strip-line. In the following description, the same points as in the first embodiment will be omitted.

Figure 19:
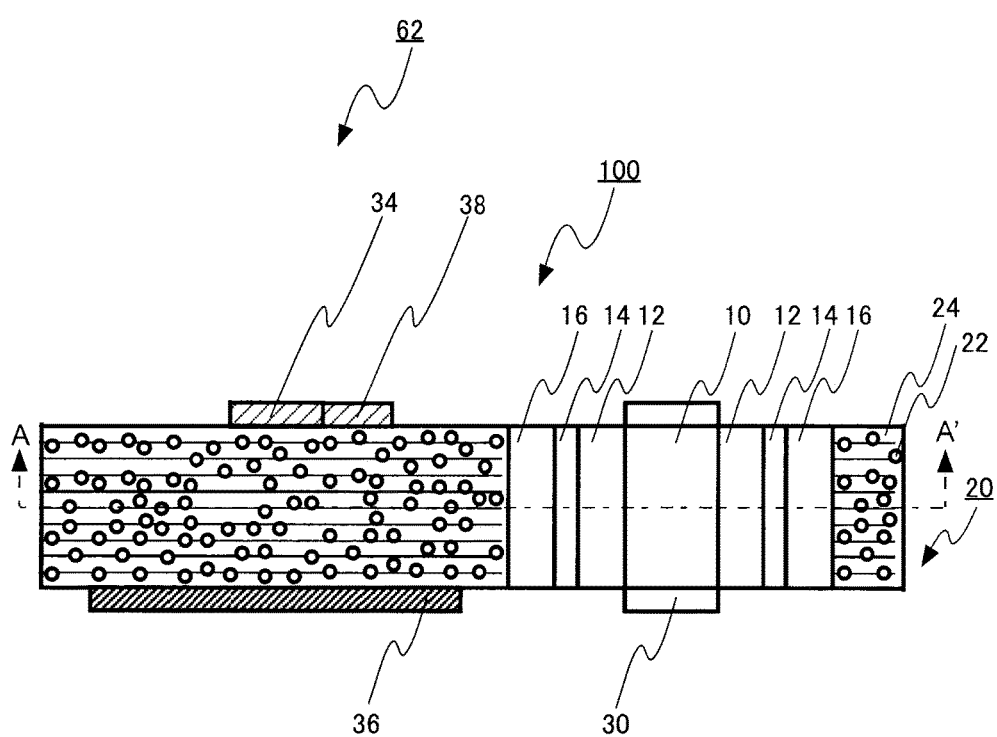
FIG. 19 is a schematic cross-sectional view of a wiring board of a third embodiment.
Figure 20:
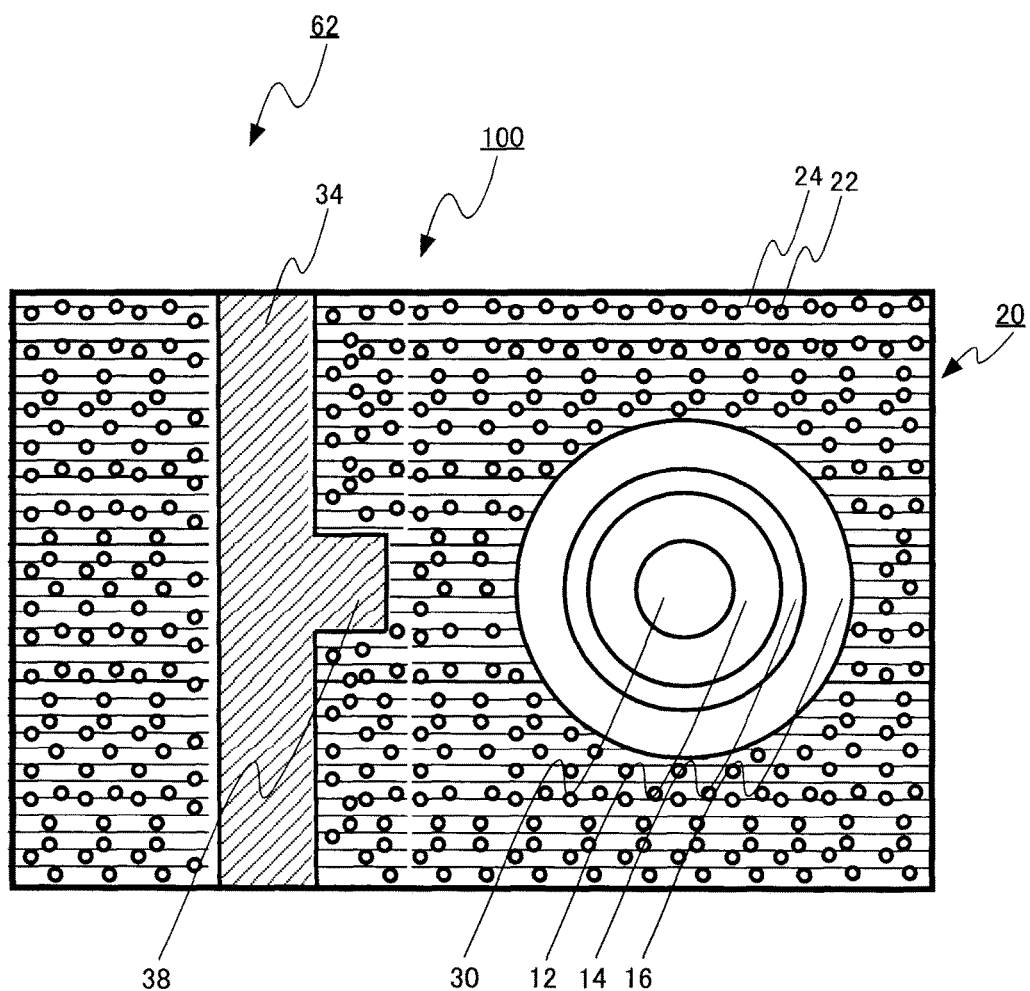
FIG. 20 is a schematic top view of the wiring board of the third embodiment.

FIG. 19 is a schematic cross-sectional view of a wiring board 100 of the present embodiment. FIG. 20 is a schematic top view of the wiring board 100 of the present embodiment.

A micro strip-line 62 includes an electrode wiring 36 disposed on one surface of the wiring board 100 and an electrode wiring 34 disposed on the other surface of the wiring board 100, for example. The electrode wiring 36 is used as a ground line, and the electrode wiring 34 is used as a signal line.

The electrode wiring 34 may be also provided with a stub 38. The stub 38 functions as a capacitor or an inductor, depending on the size thereof.

It is noted that a form of the micro strip-line 62 preferably used in the present embodiment is not limited to the above-described form, and any known micro strip-line can be preferably used.

According to the wiring board 100 of the present embodiment, with the above-described configuration, it is possible to provide a wiring board 100 provided with a low-loss through via 10 and the micro strip-line 62.

Fourth Embodiment

A wiring board of the present embodiment is a wiring board of the first embodiment in which an electrode wiring is further provided, and the electrode wiring includes a coplanar line. In the following description, the same pints as in the first embodiment will be omitted.

Figure 21:
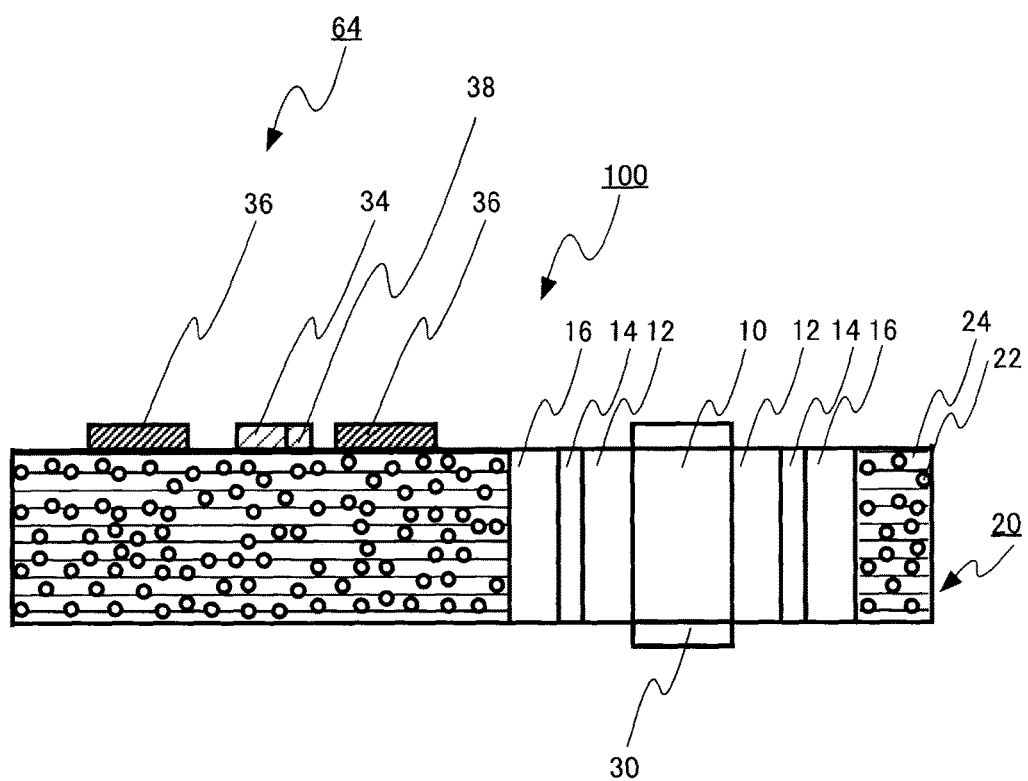
FIG. 21 is a schematic cross-sectional view of a wiring board of a fourth embodiment.
Figure 22:
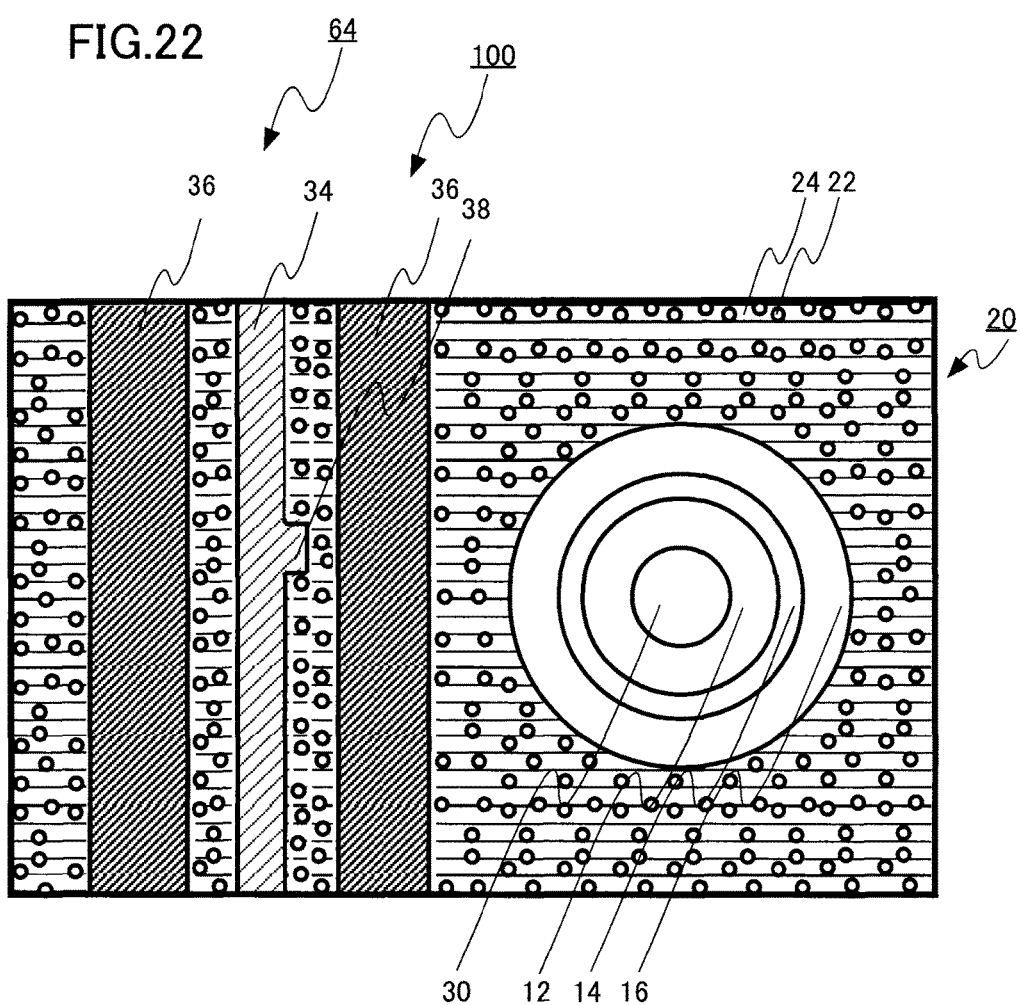
FIG. 22 is a schematic top view of the wiring board of the fourth embodiment.

FIG. 21 is a schematic cross-sectional view of a wiring board 100 of the present embodiment. FIG. 22 is a schematic top view of the wiring board 100 of the present embodiment.

A coplanar line 64, for example, includes two parallel electrode wirings 36 disposed on the surface of the wiring board 100 and an electrode wiring 34 disposed between the two parallel electrode wirings 36. The two parallel electrode wirings 36 are used as ground lines, and the electrode wiring 34 is used as a signal line.

On the electrode wiring 34, there may be disposed a stub 38. The stub 38 functions as a capacitor or an inductor, depending on the size thereof.

It is noted that a form of the coplanar line 64 preferably used in the present embodiment is not limited to the above-described form, and any known coplanar line can be preferably used.

According to the wiring board 100 of the present embodiment, with the above-described configuration, it is possible to provide the wiring board 100 provided with a low-loss through via 10 and the coplanar line 64.

Fifth Embodiment

A wiring board of the present embodiment is a wiring board of the first embodiment in which an electrode wiring is further provided, and the electrode wiring includes a coaxial line. In the following description, the same points as in the first embodiment will be omitted.

Figure 23:
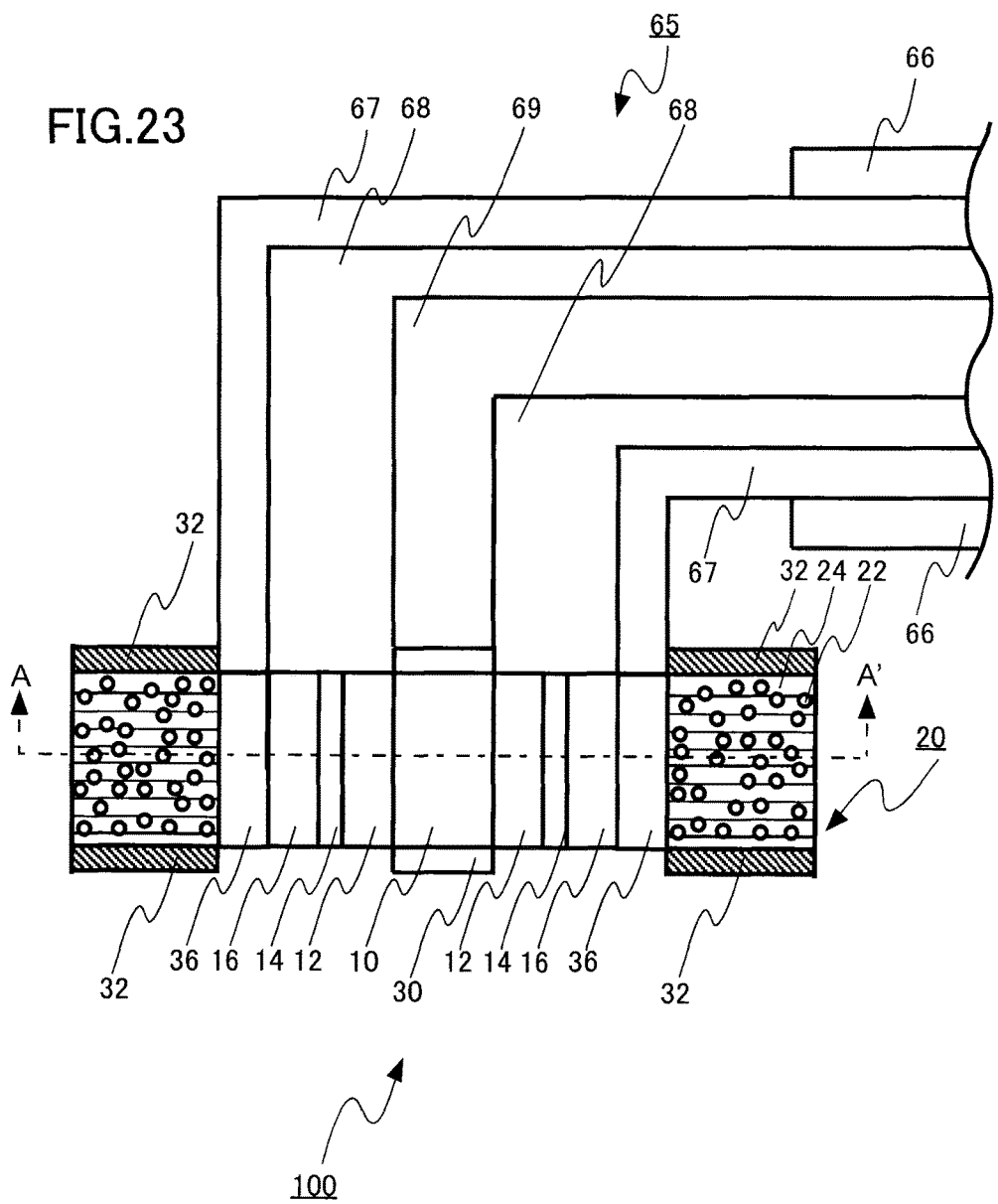
FIG. 23 is a schematic cross-sectional view of a wiring board of a fifth embodiment.

FIG. 23 is a schematic cross-sectional view of a wiring board 100 of the present embodiment.

A coaxial line 65 includes at least a coaxial signal line 69. The coaxial signal line 69 transmits a signal having passed through the through via 10 to another device such as a semiconductor chip.

The coaxial line 65 may further include a coaxial line insulating film 68 disposed around the coaxial signal line 69, a coaxial line ground line 67 disposed around the coaxial line insulating film 68, and a covering 66 disposed around the coaxial line ground line 67.

The coaxial line ground line 67 functions as a ground for a signal passing through the coaxial signal line 69. The coaxial line insulating film 68 electrically insulates the coaxial signal line 69 from the coaxial line ground line 67. The covering 66 is preferably disposed so that the coaxial line ground line 67 is prevented from being in electric contact with other electric components and the like.

Further, on the wiring board 100, there may be disposed an electrode wiring 36 to function as the ground and to be in electrically contact with the coaxial line ground line 67.

According to the wiring board 100 of the present embodiment, with the above-described configuration, it is possible to provide the wiring board 100 provided with the low-loss through via 10 and the coaxial line 65.

Sixth Embodiment

A wiring board of the present embodiment is a wiring board of the first embodiment in which an electrode wiring is further provided, and at least one selected from the group consisting of the electrode wiring, a first insulating film, a second insulating film, and a third insulating film includes a capacitor. In the following description, overlapped parts as in the first embodiment will be omitted.

Figure 24:
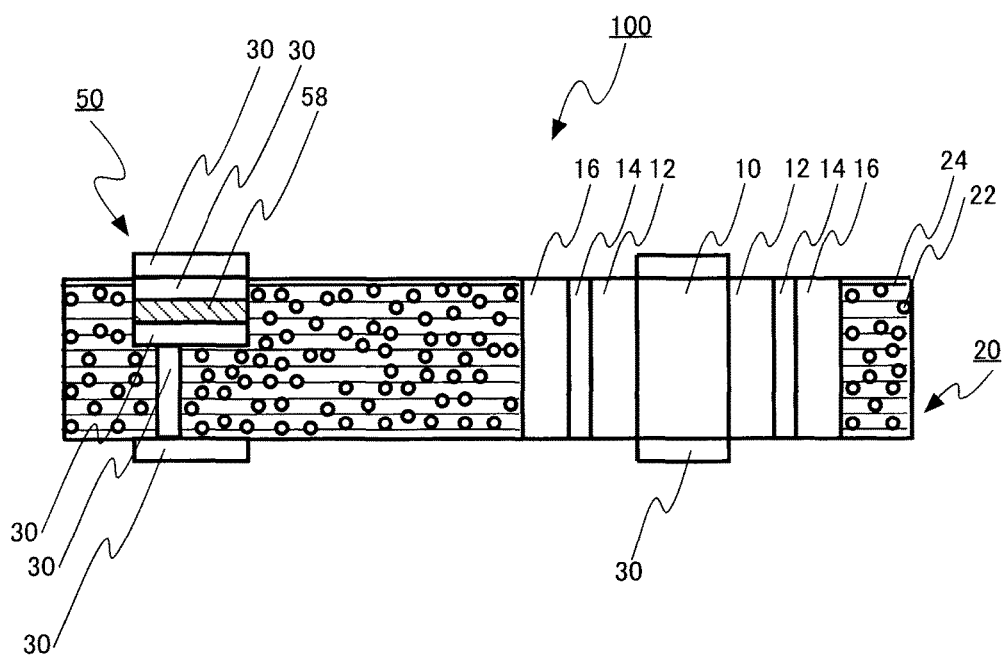
FIG. 24 is a schematic cross-sectional view of a wiring board of a sixth embodiment.
Figure 25:
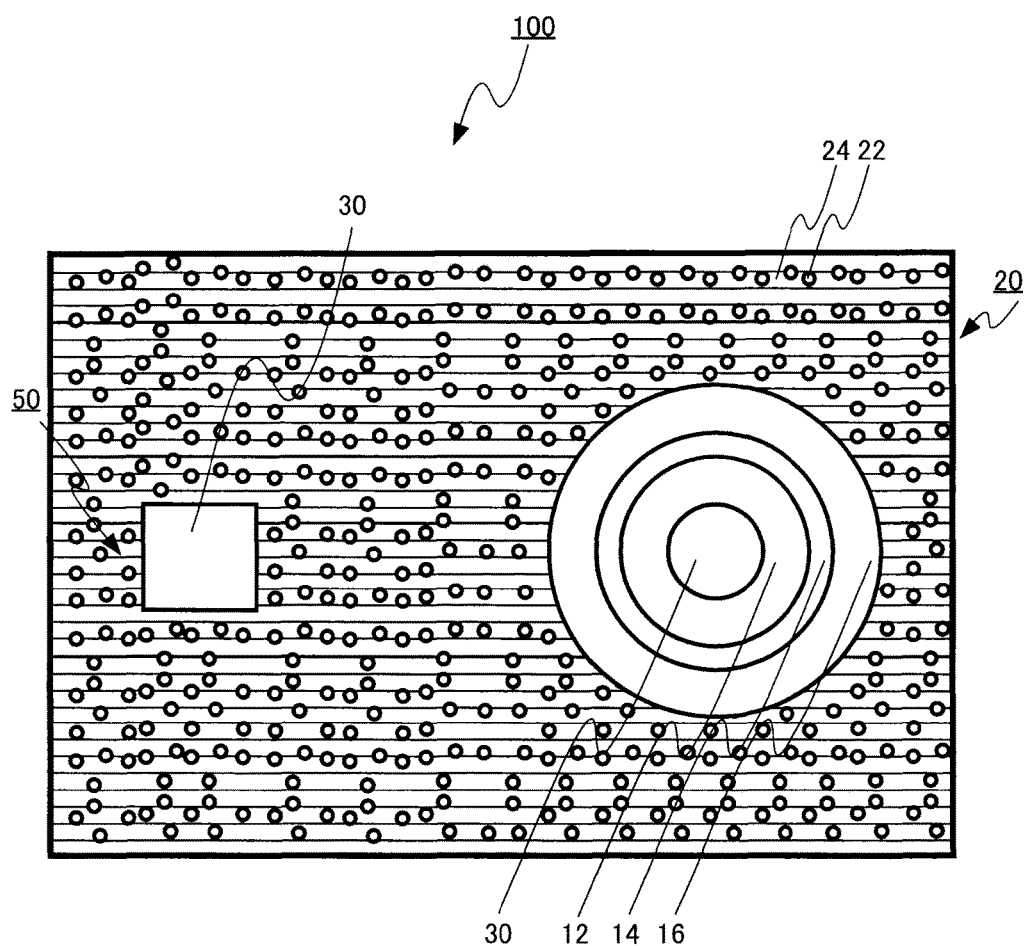
FIG. 25 is a schematic top view of the wiring board of the sixth embodiment.

FIG. 24 is a schematic cross-sectional view of a wiring board 100 of the present embodiment. FIG. 25 is a schematic top view of the wiring board 100 of the present embodiment.

A capacitor 50, for example, includes a plurality of electrode wirings 30 and a dielectric film 58 disposed between the electrode wirings 30, for example. It is noted that a form of the capacitor 50 preferably used in the present embodiment is not limited to the above-described form, and any known capacitor can be preferably used.

According to the wiring board 100 of the present embodiment, with the above-described configuration, it is possible to provide the wiring board 100 provided with through via 10 having small insertion loss and the capacitor 50.

Seventh Embodiment

A wiring board of the present embodiment is a wiring board of the first embodiment in which an electrode wiring is further provided, and at least one selected from the group consisting of the electrode wiring, a first insulating film, a second insulating film, and a third insulating film includes a resistor. In the following description, overlapped parts as in the first embodiment will be omitted.

Figure 26:
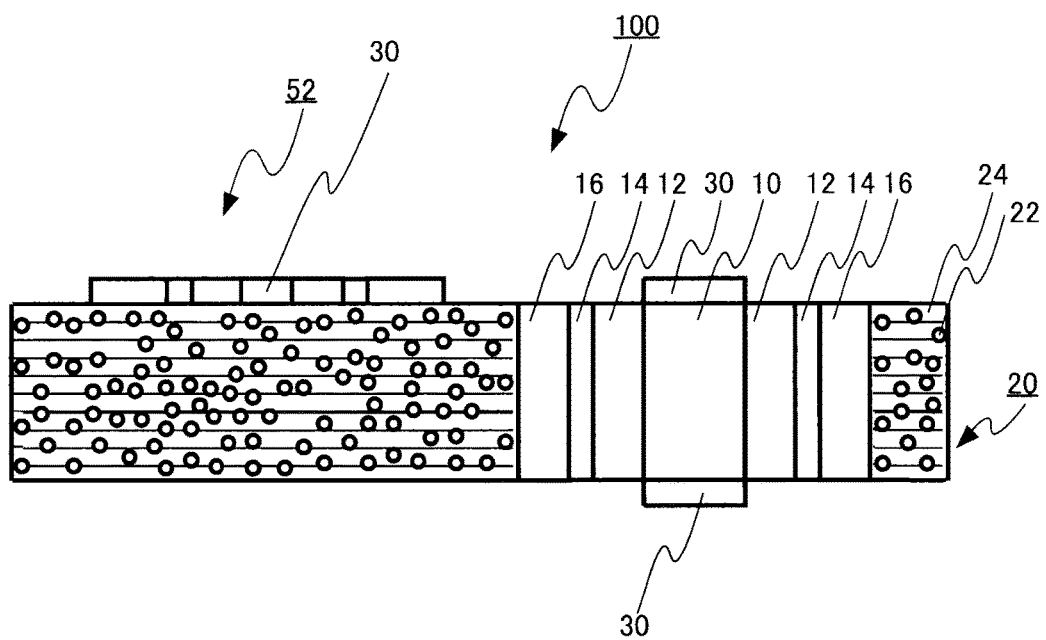
FIG. 26 is a schematic cross-sectional view of a wiring board of a seventh embodiment.
Figure 27:
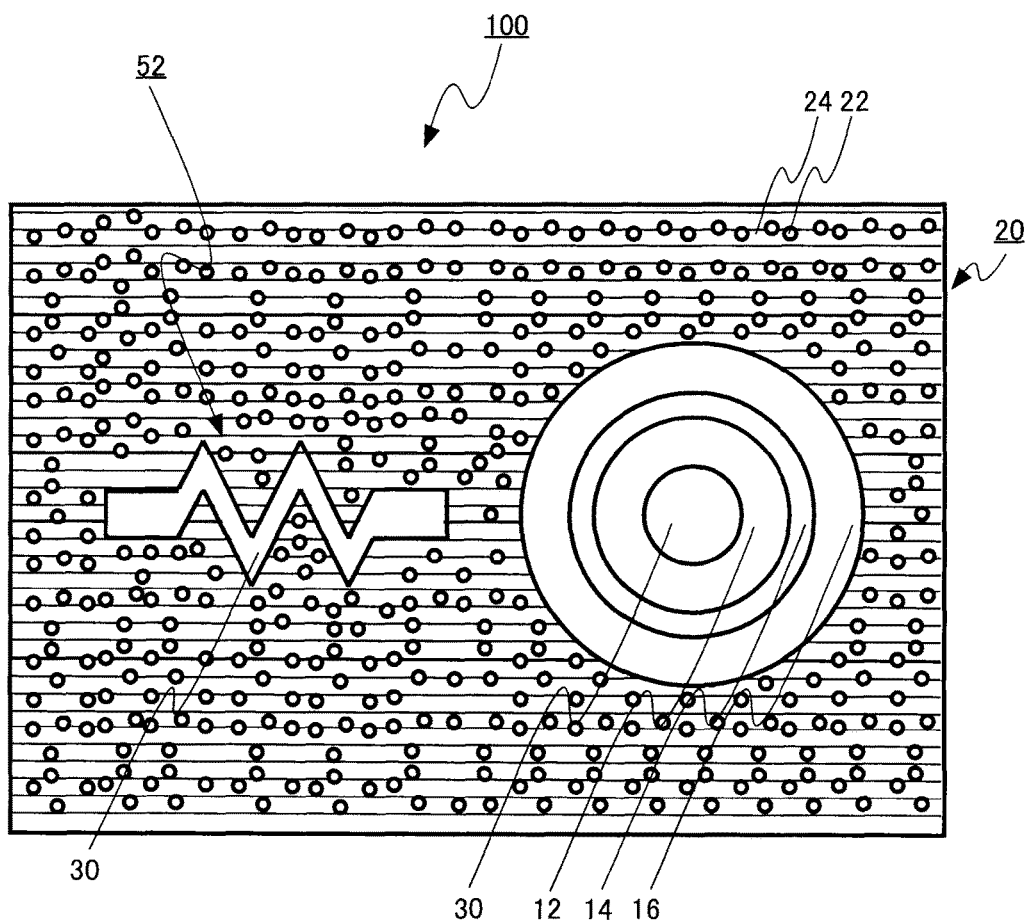
FIG. 27 is a schematic top view of the wiring board of the seventh embodiment.

FIG. 26 is a schematic cross-sectional view of a wiring board 100 of the present embodiment. FIG. 27 is a schematic top view of the wiring board 100 of the present embodiment.

A resistor 52, for example, includes an electrode wiring 30 having a plurality of bent portions. It is noted that a form of the resistor 52 preferably used in the present embodiment is not limited to the above-described form, and any known resistor can be preferably used.

According to the wiring board 100 of the present embodiment, with the above-described configuration, it is possible to provide the wiring board 100 provided with a through via 10 having small insertion loss and the resistor 52.

Eighth Embodiment

A wiring board of the present embodiment is a wiring board of the first embodiment in which an electrode wiring is further provided, and at least one selected from the group consisting of the electrode wiring, a first insulating film, a second insulating film, and a third insulating film includes an inductor. In the following description, overlapped parts as in the first embodiment will be omitted.

Figure 28:
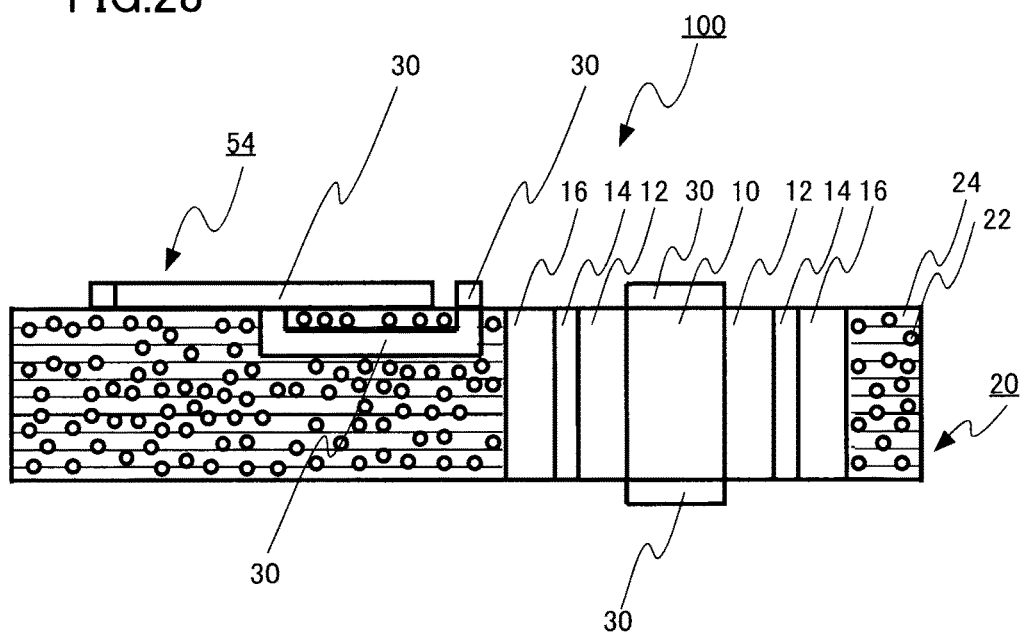
FIG. 28 is a schematic cross-sectional view of a wiring board of an eighth embodiment.
Figure 29:
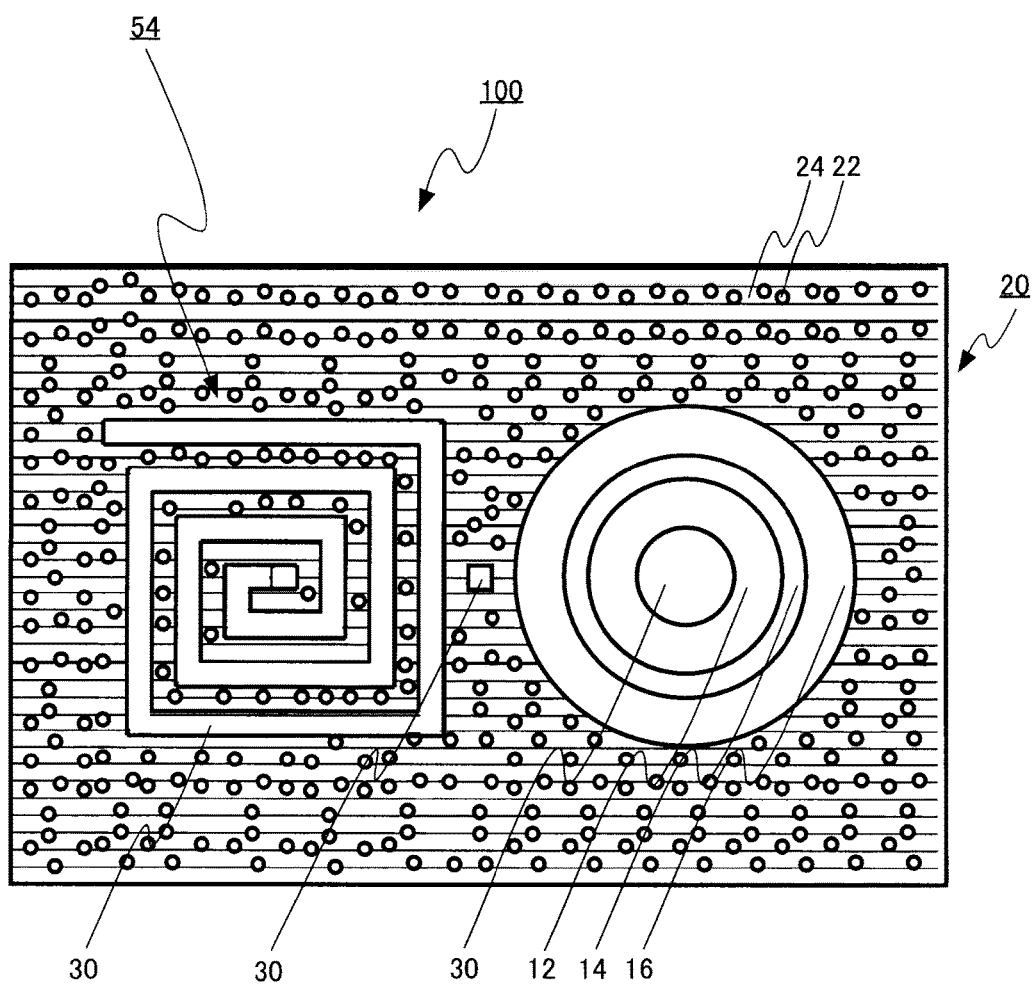
FIG. 29 is a schematic top view of the wiring board of the eighth embodiment.

FIG. 28 is a schematic cross-sectional view of a wiring board 100 of the present embodiment. FIG. 29 is a schematic top view of the wiring board 100 of the present embodiment.

An inductor 54, for example, includes, as shown in FIG. 29, an electrode wiring having a plurality of bent portions disposed on the surface of the wiring board and an electrode wiring disposed in the wiring board and used to take out electricity from the inner part of an electrode wiring, for example. It is noted that a form of the inductor 54 preferably used in the present embodiment is not limited to the above-described form, and any known inductor can be preferably used.

According to the wiring board 100 of the present embodiment, with the above-described configuration, it is possible to provide the wiring board 100 provided with a through via 10 having small insertion loss and the inductor 54.

Ninth Embodiment

A semiconductor device of the present embodiment is provided with (i) a chip-scale package provided with the wiring board of any one of the first to eighth embodiments and a semiconductor chip, (ii) a package substrate, and (iii) solder balls disposed between the chip-scale package and the package substrate. In the following description, overlapped parts as in the first to eighth embodiments will be omitted.

Figure 30:
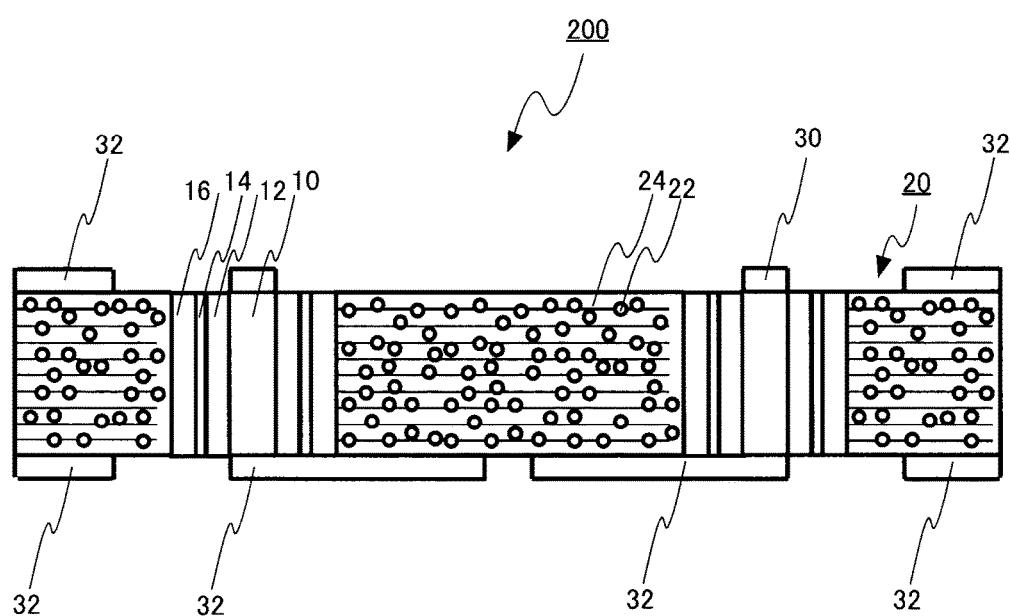
FIG. 30 is a schematic cross-sectional view of a wiring board 200 used in a ninth embodiment.
Figure 31:
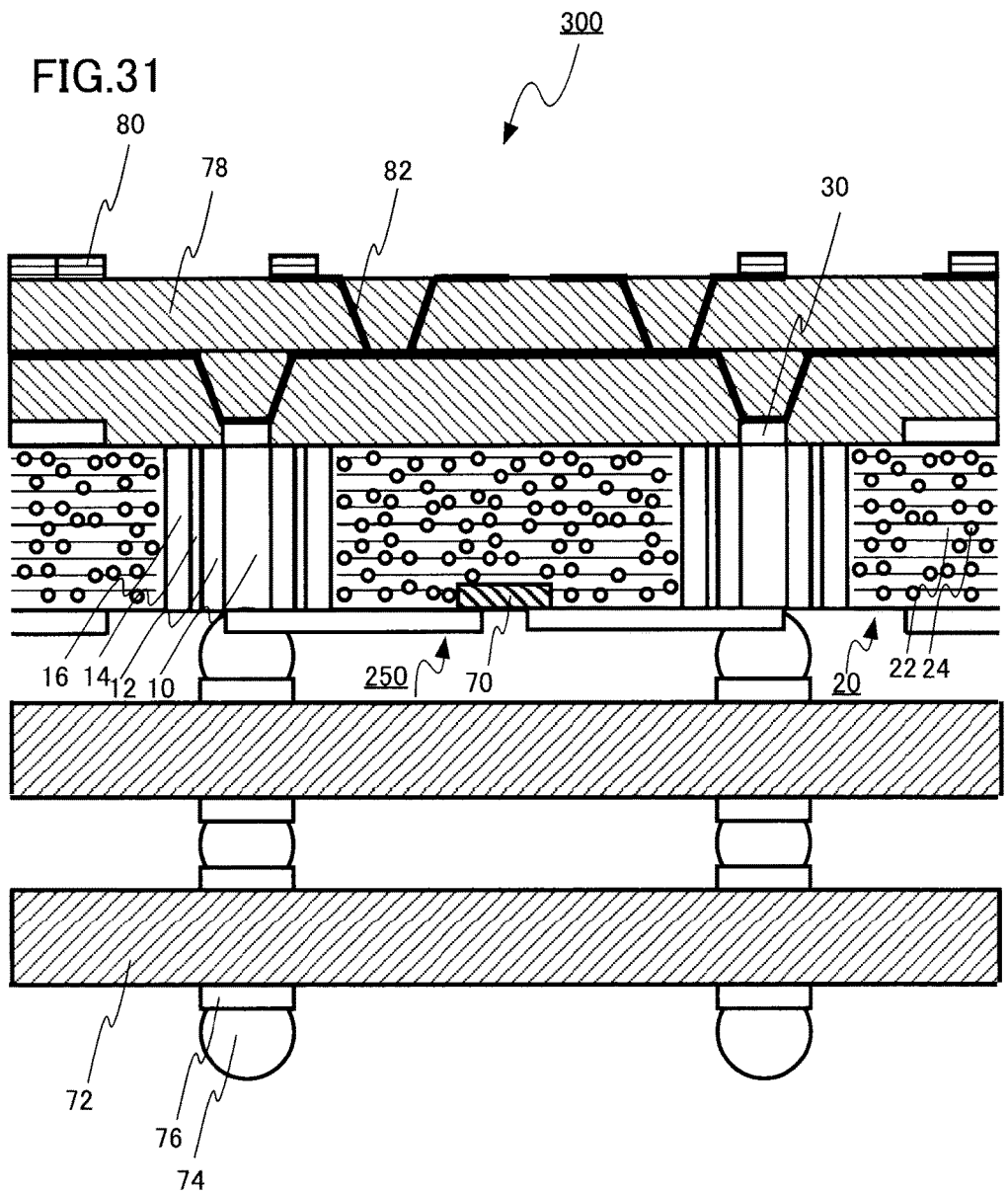
FIG. 31 is a schematic cross-sectional view of a semiconductor device 300 of the ninth embodiment.

FIG. 30 is a schematic cross-sectional view of a wiring board 200 used in the present embodiment. FIG. 31 is a schematic cross-sectional view of a semiconductor device 300 of the present embodiment.

The chip-scale package is also called a chip-size package and is generally a package provided with a chip such as a semiconductor chip. In particular, a chip-scale package in which a part of a semiconductor substrate is exposed is sometimes called a wafer-level chip-scale package or simply called a wafer-level package.

The semiconductor device 300 may be provided with a rewiring layer 78 as shown in FIG. 31.

A method of manufacturing the semiconductor device 300 of the present embodiment will be described below. A semiconductor chip 70 is mounted on an adhesive layer (not shown) by using a flip chip bonder or the like.

The rewiring layer 78 is formed by performing the following steps in order: applying polyimide; patterning by exposure, setting by curing, surface cleaning by ashing, and forming a wiring layer. As a material for wiring, titanium (Ti), nickel (Ni), aluminum (Al), silver (Ag), gold (Au), cupper (Cu), tungsten (W), and the like are preferably used. A component 80 is mounted by a flip bonder or the like after the rewiring layer 78 is formed.

Next, the package substrate 72 and the chip-scale package 250 are made to face each other, and a first conductive junction structure is formed on the surface of the chip-scale package 250 facing the package substrate 72. In addition, a second conductive junction structure is joined on the surface of the package substrate 72 facing the chip-scale package 250.

For example, the first conductive junction structure includes a solder ball 74, and the second conductive junction structure includes a pad electrode 76. To the contrary, of course, the first conductive junction structure may include a pad electrode 76, and the second conductive junction structure may include a solder ball 74, for example.

As a solder for the solder ball 74, used known solders can be used, such as Pb-based solder, Sn-based solder, or the like. Sn—Ag—Cu-based solder is easy to use and since it is cheap, and can thus be specifically preferably used.

Finally, the surface of the chip-scale package 250 facing the package substrate 72 and the surface of the package substrate 72 facing the chip-scale package 250 are joined. This joining is performed by a flip chip bonder or the like by using the solder ball 74 and the like.

The total layer number of the stacked package substrates 72 and chip-scale package 250 is preferably three. However, the order of the manufacturing method is not limited to the above process. For example, in the present embodiment, the component 80 is mounted on the chip-scale package 250 as a mounting step before the package substrate 72 is bonded; however, the order is not limited thereto.

EXAMPLES

An example will be described below in detail while comparing with comparative examples.

Example 1

A wiring board 100 shown in FIG. 1 was manufactured. The through via 10, the electrode wiring 30, and the electrode wiring 32 were made of Cu, and the first insulating film 12, the second insulating film 14, and the third insulating film 16 were made of SOG. As the filler 22, silica was used, and as the resin 24, an epoxy resin was used. The film thickness of the substrate was 400 µm.

Comparative Example 1

Figure 32:
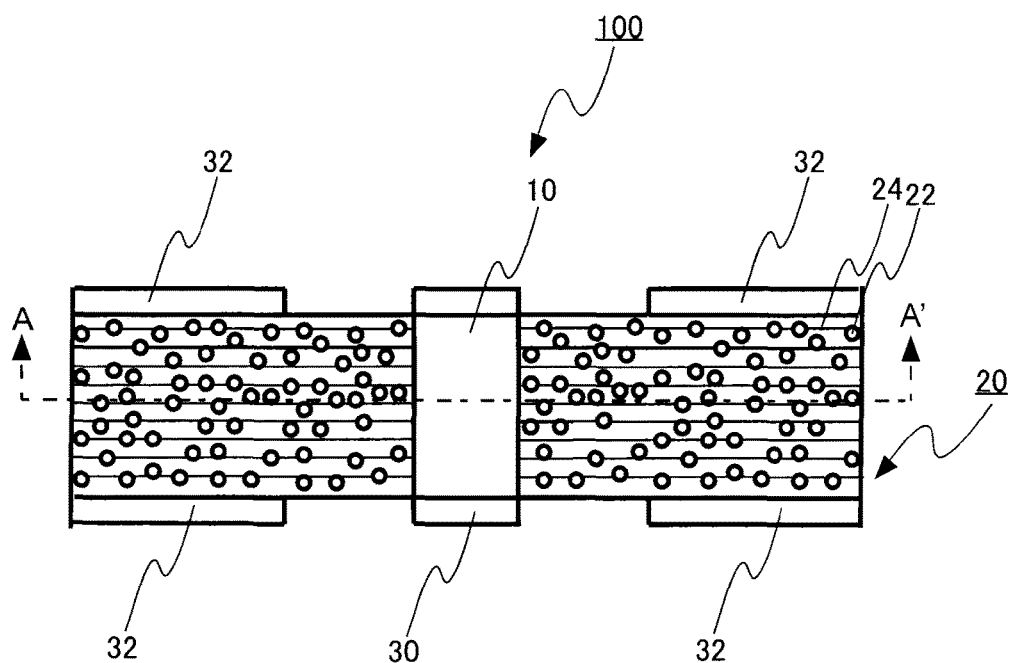
FIG. 32 is a schematic cross-sectional view of a wiring board of Comparative Example 1.
Figure 33:
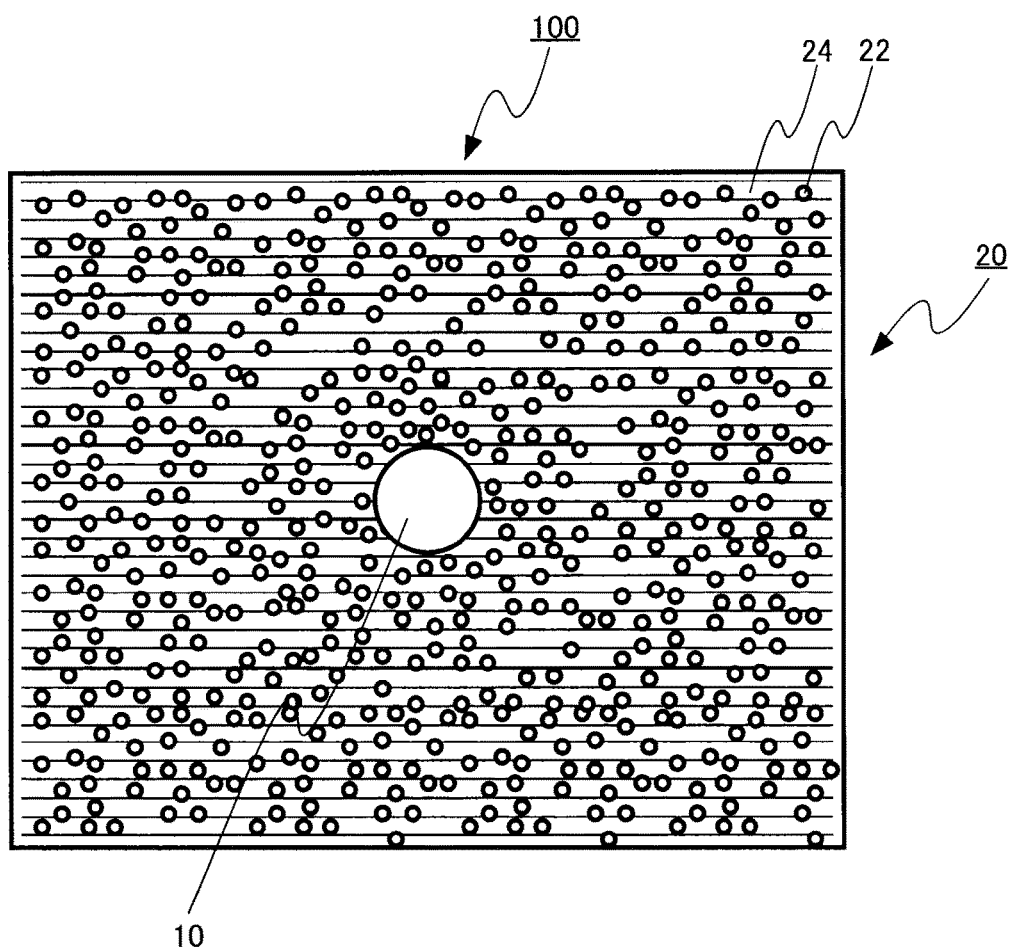
FIG. 33 is a schematic cross-sectional view of the wiring board of Comparative Example 1 taken along line A-A'.

A wiring board 100 was manufactured similarly as the wiring board 100 of Example 1. FIG. 32 is a schematic cross-sectional view of the wiring board 100 of this comparative example. FIG. 33 is a schematic cross-sectional view of the wiring board 100 of this comparative example taken along line A-A'. In this wiring board 100, the filler-containing resin 20 was in direct contact with the periphery of the through via 10. The film thickness of the substrate was 400 µm.

Comparative Example 2

Figure 34:
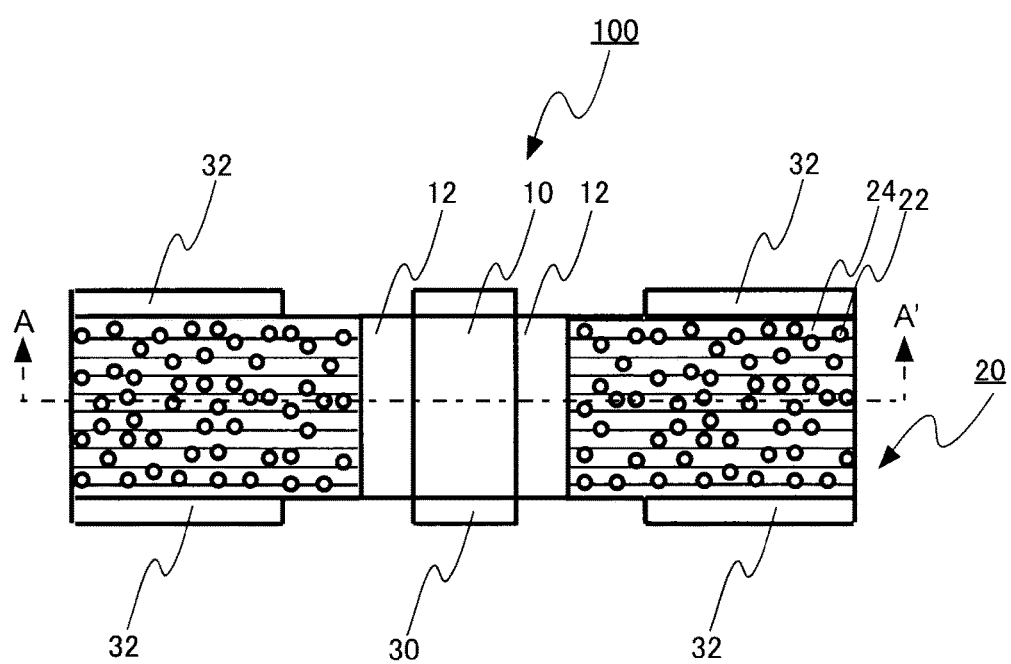
FIG. 34 is a schematic cross-sectional view of a wiring board of Comparative Example 2.
Figure 35:
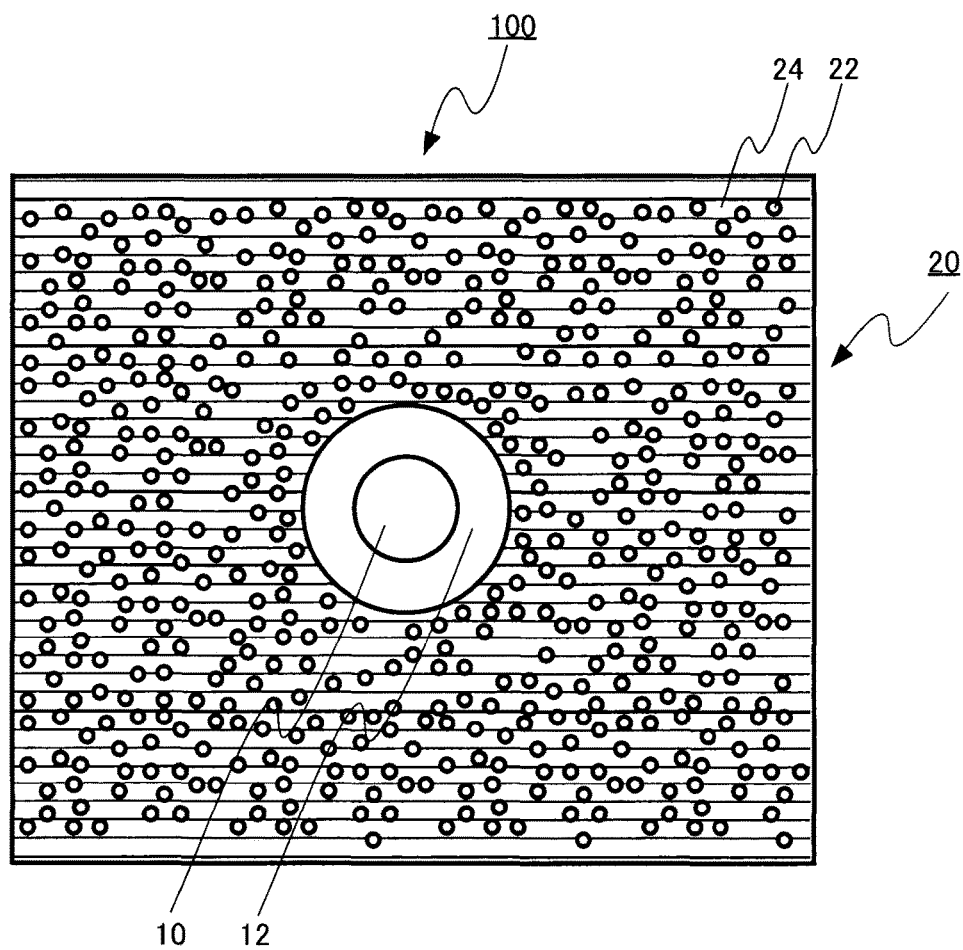
FIG. 35 is a schematic cross-sectional view of the wiring board of Comparative Example 2 taken along line A-A'.

A wiring board 100 was manufactured similarly to that of the wiring board 100 of Example 1. FIG. 34 is a schematic cross-sectional view of the wiring board 100 of this comparative example. FIG. 35 is a schematic cross-sectional view of the wiring board of this comparative example taken along line A-A'. In this wiring board 100, the first insulating film 12 is disposed around the through via 10, and the filler-containing resin 20 is dispose around the first insulating film 12. The film thickness of the substrate was 400 µm.

Comparative Example 3

Figure 36:
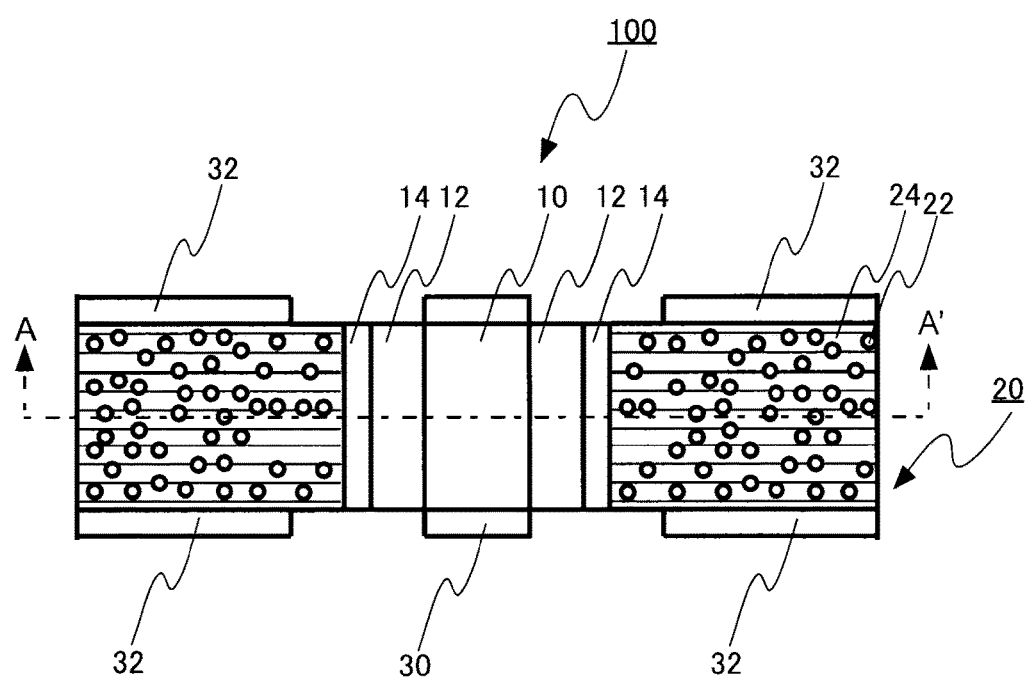
FIG. 36 is a schematic cross-sectional view of a wiring board of Comparative Example 3.
Figure 37:
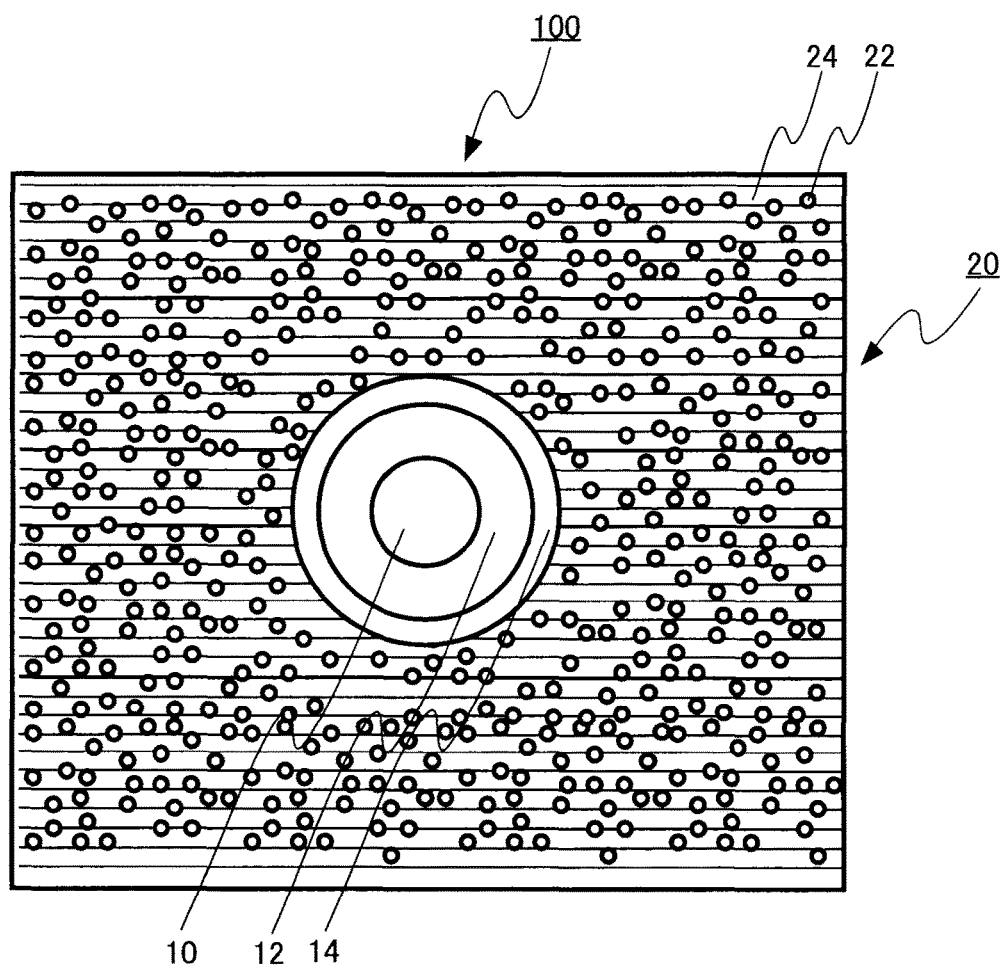
FIG. 37 is a schematic cross-sectional view of the wiring board of Comparative Example 3 taken along line A-A'.

A wiring board 100 was manufactured similarly to that of the wiring board 100 of Example 1. FIG. 36 is a schematic cross-sectional view of the wiring board 100 of this comparative example. FIG. 37 is a schematic cross-sectional view of the wiring board of this comparative example taken along line A-A'. In this wiring board 100, the first insulating film 12 is disposed around the through via 10, and the second insulating film 14 is disposed around the first insulating film 12, and the filler-containing resin 20 is disposed around the second insulating film 14. The film thickness of the substrate was 400 µm.

Figure 38:
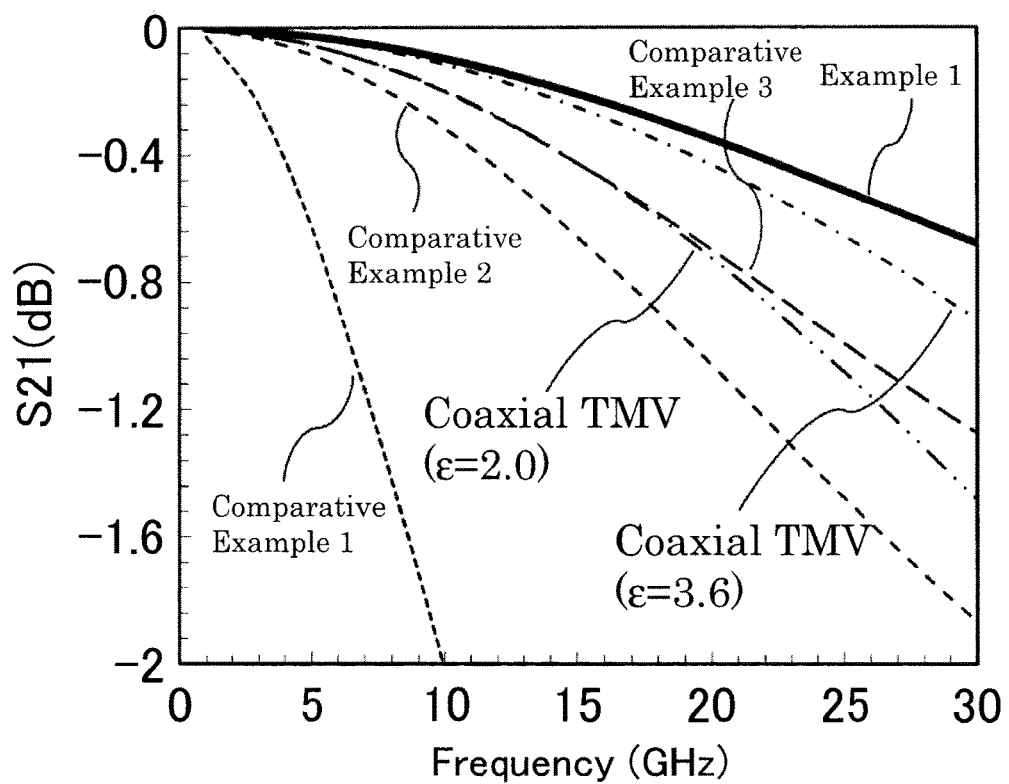
FIG. 38 is a diagram showing frequency dependencies of a scattering parameter S21 of the through via of the wiring boards of Example 1, Comparative Example 1, Comparative Example 2, and Comparative Example 3.

FIG. 38 is a diagram showing the frequency dependencies of scattering parameters S21 of the through vias of the wiring boards of Example 1, Comparative Example 1, Comparative Example 2, and Comparative Example 3. Assuming the case that the effects of Comparative Example 1, Comparative Example 2, and Comparative Example 3 were maximized, the results were estimated. The estimated results are denoted by Coaxial TMV ($\in$=2.0) and Coaxial TMV ($\in$=3.6) in the graph. Each of the diameters of the through vias here was 20 µm. In Comparative Example 2, the film thickness of the first insulating film was 8 µm. In Comparative Example 3, the film thickness of the first insulating film was 8 µm, and the film thickness of the second insulating film was 1.5 µm. In Example 1, the film thickness of the first insulating film was 10 µm, the film thickness of the second insulating film was 2 µm, and the film thickness of the third insulating film was 10 µm. Further, the relative permittivity of the first insulating film and the relative permittivity of the third insulating film were both 3.5, and the relative permittivity of the second insulating film was 2.4. Regarding the through via of Example 1, the insertion loss is lowest especially in the signal frequency band of 10 GHz to 30 GHz.

In the wiring board of Comparative Example 1, an electric field spreads on the surface of the through via due to the skin effect of radio wave while electricity is flowing through the through via. Thus, since the two types of substances, the filler 22 and the resin 24, having different permittivities are distributed in the area in which the radio wave spreads, the radio wave is scattered, whereby the insertion loss is large.

In the wiring board of Comparative Example 2, the radio wave spreads around the through via in the same way as in the case of the through via of the wiring board of Comparative Example 1. However, because the first insulating film having a uniform permittivity is disposed around the through via, the scattering loss due to filler is reduced. However, in order to achieve sufficient effect, it is preferable to make the film thickness of the insulating film thicker depending on how much the radio wave spreads. However, there is a problem that, even if the film thickness is made thicker, the advantageous effect of the thicker film thickness is at most the same as in the case that an effect of the increase in the scattering due to the filler contained in the resin is not included.

In the wiring board of Comparative Example 3, the radio wave can be trapped in the second insulating film. Thus, when the film thickness of the insulating film is made thin, sufficiently advantageous effect can be obtained compared with the wiring board of Comparative Example 2. However, even in the case of Comparative Example 3, there is a problem that, even if the film thickness is made thicker, the advantageous effect is about the same as in the case that no filler is contained.

In the wiring board of Example 1, the radio wave generated when an electric signal is transmitted to the through via can be trapped in the insulating ring having a lower permittivity. As a result, scattering due to filler can be prevented, whereby insertion loss can be lower. Further, the advantageous effect can realize a lower loss compared with the through mold via containing no filler.

Figure 39:
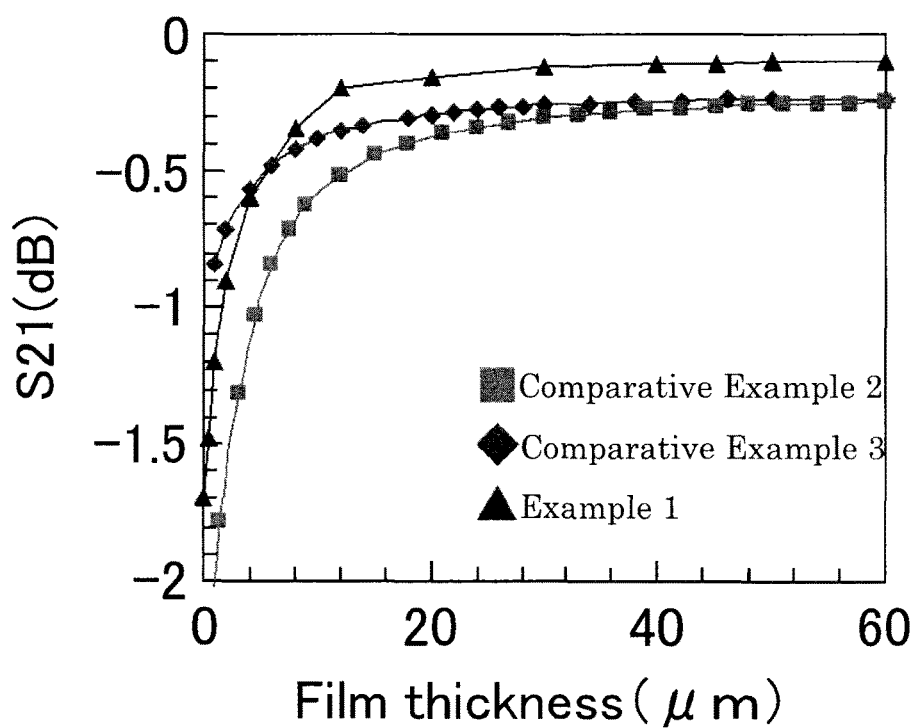
FIG. 39 is a diagram showing relationships between loss and a film thickness of an insulating film around the through via.

FIG. 39 is a diagram showing a relationship between the film thickness of the insulating film covering the periphery of the through via and the loss. The frequency is 10 GHz. Here, regarding Comparative Example 2 and Comparative Example 3, the graph shows the loss (scattering parameter S21) in relation to the film thickness of the first insulating film. Regarding Example 1, the graph shows the loss (scattering parameter S21) in relation to the sum of the film thickness of the first insulating film and the film thickness of the third insulating film.

In Example 1, the film thickness of the first insulating film and the film thickness of the third insulating film are equal to each other, which means that the second insulating film is disposed at the center of the first insulating film and the third insulating film. In addition, the film thicknesses of the second insulating films of Comparative Example 3 and Example 1 are 2 μm.

Regarding Comparative Example 2, it can be seen that the loss tends to decrease with increase in the thickness of the first insulating film. The effect is saturated when the film thickness is approximately 30 μm or more. Also regarding Comparative Example 3, the loss decreases with increase in the thickness of the first insulating film. Comparative Example 3 is also effective when the film thickness of the insulating film is thinner than that of Comparative Example 2.

When the sum of the film thicknesses of the first insulating film and the third insulating film is not more than 5 μm, Example 1 is less effective than Comparative Example 2 and Comparative Example 3; however, when the sum is greater than 10 μm, the loss is smaller than those of the former two structures, and when the thickness is 16 μm or more, the loss is saturated. Thus, because a sum of the film thickness of the first insulating film, the film thickness of the second insulating film, and the film thickness of the third insulating film is not less than 18 μm at this time, it is preferable that the sum of the film thickness of the first insulating film and the film thickness of the third insulating film is not less than 89% of the sum of the film thickness of the first insulating film, the film thickness of the second insulating film, and the film thickness of the third insulating film. Further, this advantageous effect is obtained when the second insulating film is disposed at the center of the entire insulating films.

Figure 40:
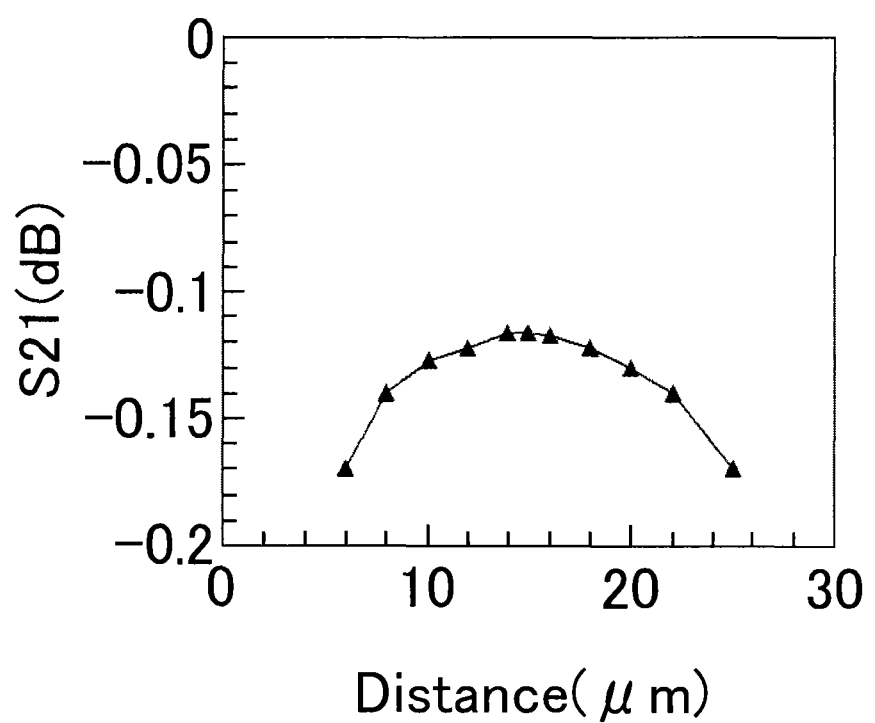
FIG. 40 is a diagram showing a relationship between loss and a distance from a surface of the through via to the center of a second insulating film.

FIG. 40 shows the relationship between the distance from the surface of the through via to the center of the second insulating film and the loss. The frequency is 10 GHz. The film thickness of the entire insulating films is made 30 μm, and the center is thus 15 μm. From this result, it can be understood that the advantageous effects is greater when the second insulating film is located closer to the center of the entire insulating films.

For this reason, it is preferable that the center of the film thickness of the second insulating film is located within ±5 μm of approximately the center of the film thickness (30 μm) of the entire insulating films; thus, a ratio of (i) a difference between a distance from the inside surface of the first insulating film to the center of the film thickness of the second insulating film and a half of a distance from the inside surface of the first insulating film to the outside surface of the third insulating film to (ii) a distance from the inside surface of the first insulating film to the outside surface of the third insulating film is not more than 0.2.

The wiring board of at least one of the above-described embodiments includes: a through via; a first insulating film disposed around the through via; a second insulating film disposed around the first insulating film, the second insulating film having a relative permittivity lower than a relative permittivity of the first insulating film; a third insulating film disposed around the second insulating film, the third insulating film having a relative permittivity higher than the relative permittivity of the second insulating film; and a resin disposed around the third insulating film, the resin including fillers, and thus it is possible to reduce the loss in the through via and to provide a wiring board provided with a low-loss through via.

While certain embodiments have been described, these embodiments have been presented by way of example only, and are not intended to limit the scope of the inventions. Indeed, the wiring board and the method of manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A wiring board comprising:
   a through via;
   a first insulating film disposed around the through via;
   a second insulating film disposed around the first insulating film, the second insulating film having a relative permittivity lower than a relative permittivity of the first insulating film;
   a third insulating film disposed around the second insulating film, the third insulating film having a relative permittivity higher than the relative permittivity of the second insulating film; and
   a resin disposed around the third insulating film, the resin including fillers.

2. The wiring board according to claim 1, wherein the relative permittivity of the first insulating film and the relative permittivity of the third insulating film are not less than 2.4 and not more than 9.

3. The wiring board according to claim 1, wherein a film thickness of the second insulating film is not less than 2.7% and not more than 20% of a sum of a film thickness of the first insulating film and a film thickness of the third insulating film.

4. The wiring board according to claim 1, wherein a ratio of (i) a difference between a distance from an inside surface of the first insulating film to a center of the film thickness of the second insulating film and a half of a distance from the inside surface of the first insulating film to an outside surface of the third insulating film to (ii) the distance from the inside surface of the first insulating film to the outside surface of the third insulating film is not more than 0.2.

5. The wiring board according to claim 1, wherein a sum of the film thickness of the first insulating film and the film thickness of the third insulating film is not less than 89% of a sum of the film thickness of the first insulating film, a film thickness of the second insulating film, and the film thickness of the third insulating film.

6. The wiring board according to claim 1, wherein the through via includes at least one type of conductor selected from a group consisting of Au, Ag, Cu, Ni, W, Sn, and a conductive organic substance.

7. The wiring board according to claim 1, further comprising an electrode wiring disposed on or inside the resin.

8. The wiring board according to claim 7, wherein the electrode wiring includes at least one type of transmission line selected from a group consisting of a strip-line, a micro strip-line, a coplanar line, and a coaxial line.

9. The wiring board according to claim 7, wherein at least one selected from the electrode wiring, the first insulating film, the second insulating film, and the third insulating film constitutes at least one type of electric component selected from a group consisting of a capacitor, a resistor, and an inductor.

10. A method of manufacturing a wiring board, the method comprising:
   forming a through via;
   forming a first insulating film around the through via;
   forming, around the first insulating film, a second insulating film having a relative permittivity lower than a relative permittivity of the first insulating film;
   forming, around the second insulating film, a third insulating film having a relative permittivity higher than the relative permittivity of the second insulating film; and
   forming a resin around the third insulating film, the resin including fillers.

11. The method according to claim 10, wherein the relative permittivity of the first insulating film and the relative permittivity of the third insulating film are not less than 2.4 and not more than 9.

12. The method according to claim 10, wherein a film thickness of the second insulating film is not less than 2.7% and not more than 20% of a sum of a film thickness of the first insulating film and a film thickness of the third insulating film.

13. The method according to claim 10, wherein a ratio of (i) a difference between a distance from an inside surface of the first insulating film to a center of the film thickness of the second insulating film and a half of a distance from the inside surface of the first insulating film to an outside surface of the third insulating film to (ii) the distance from the inside surface of the first insulating film to the outside surface of the third insulating film is not more than 0.2.

14. The method according to claim 10, wherein a sum of the film thickness of the first insulating film and the film thickness of the third insulating film is not less than 89% of a sum of the film thickness of the first insulating film, a film thickness of the second insulating film, and the film thickness of the third insulating film.

15. The method according to claim 10, wherein the through via includes at least one type of conductor selected from a group consisting of Au, Ag, Cu, Ni, W, Sn, and a conductive organic substance.

* * * * *